(12) United States Patent
Choi et al.

(10) Patent No.: US 12,484,304 B2
(45) Date of Patent: Nov. 25, 2025

(54) DISPLAY APPARATUS AND METHOD OF MANUFACTURING THE SAME

(71) Applicant: SAMSUNG DISPLAY CO., LTD., Yongin-si (KR)

(72) Inventors: Kyunghyun Choi, Yongin-si (KR); Moosoon Ko, Yongin-si (KR); Jingoo Jung, Yongin-si (KR); Sugwoo Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/419,366

(22) Filed: Jan. 22, 2024

(65) Prior Publication Data
US 2024/0164152 A1 May 16, 2024

Related U.S. Application Data

(62) Division of application No. 17/328,679, filed on May 24, 2021, now Pat. No. 11,917,870.

(30) Foreign Application Priority Data

Aug. 14, 2020 (KR) .................. 10-2020-0102710

(51) Int. Cl.
*H10K 59/126* (2023.01)
*H10D 86/40* (2025.01)
(Continued)

(52) U.S. Cl.
CPC ........... *H10D 86/423* (2025.01); *H10K 59/12* (2023.02); *H10K 59/1213* (2023.02);
(Continued)

(58) Field of Classification Search
CPC ............ H10D 86/423; H10D 59/1213; H10D 59/126; H10D 59/12
(Continued)

(56) References Cited

U.S. PATENT DOCUMENTS 10,186,191 B2 1/2019 Kang et al.
10,199,507 B2 2/2019 Jeon et al.
(Continued)

FOREIGN PATENT DOCUMENTS

KR 10-2014-0079093 A 6/2014
KR 10-2014-0102043 A 8/2014
(Continued)

*Primary Examiner* — Dzung Tran
(74) *Attorney, Agent, or Firm* — Womble Bond Dickinson (US) LLP

(57) ABSTRACT

A display apparatus includes: a substrate including a first area, and a second area adjacent to the first area; a plurality of first pixel circuits at the first area of the substrate, each of the plurality of first pixel circuits including a silicon-based transistor, and an oxide-based transistor; a plurality of second pixel circuits at the second area of the substrate, the plurality of second pixel circuits including transistors; a first shielding layer at the first area, the first shielding layer including a shielding pattern overlapping with the silicon-based transistor of each of the plurality of first pixel circuits; and a second shielding layer at the second area, the second shielding layer including a first through-hole between adjacent second pixel circuits from among the plurality of second pixel circuits. The first shielding layer and the second shielding layer include different materials from each other.

7 Claims, 23 Drawing Sheets

(51) Int. Cl.
    *H10K 59/12*     (2023.01)
    *H10K 59/121*     (2023.01)
    *H10K 59/65*     (2023.01)
    *H10K 59/80*     (2023.01)

(52) U.S. Cl.
    CPC ....... *H10K 59/126* (2023.02); *H10K 59/1201* (2023.02); *H10K 59/65* (2023.02); *H10K 59/8792* (2023.02)

(58) Field of Classification Search
    USPC .......................................................... 257/40
    See application file for complete search history.

(56) References Cited

U.S. PATENT DOCUMENTS

| | | |
|---|---|---|
| 10,454,067 B2 | 10/2019 | Seo et al. |
| 2003/0094615 A1 | 5/2003 | Yamazaki et al. |
| 2015/0123084 A1 | 5/2015 | Kim et al. |
| 2016/0172633 A1 | 6/2016 | Ahn et al. |
| 2017/0162606 A1 | 6/2017 | Yan et al. |
| 2018/0145094 A1 | 5/2018 | Yan et al. |
| 2019/0148672 A1 | 5/2019 | Seo et al. |
| 2019/0245159 A1* | 8/2019 | Kim .................. H10K 50/8445 |
| 2019/0296055 A1 | 9/2019 | Lius et al. |
| 2020/0105844 A1 | 4/2020 | Wang et al. |
| 2020/0203433 A1* | 6/2020 | Fichet .................. H10K 30/30 |

FOREIGN PATENT DOCUMENTS

| | | |
|---|---|---|
| KR | 10-2016-0092826 A | 8/2016 |
| KR | 10-2017-0065059 A | 6/2017 |
| KR | 10-2019-0056473 A | 5/2019 |
| KR | 10-1956814 B1 | 6/2019 |
| KR | 10-2093192 B1 | 3/2020 |

* cited by examiner

DISPLAY APPARATUS AND METHOD OF MANUFACTURING THE SAME

CROSS-REFERENCE TO RELATED APPLICATIONS

This application is a divisional of U.S. patent application Ser. No. 17/328,679, filed May 24, 2021, which claims priority to and the benefit of Korean Patent Application No. 10-2020-0102710, filed Aug. 14, 2020, the entire content of both of which is incorporated herein by reference.

BACKGROUND

1. Field

Aspects of one or more embodiments of the present disclosure relate to a display apparatus, and a method of manufacturing the same.

2. Description of Related Art

Recently, the usage of display apparatuses has diversified. Also, display apparatuses have become thinner and lighter, and thus, the uses of display apparatuses have expanded.

By increasing an area of a display area in a display apparatus, various functions connected to or related to the display apparatus have been added. In order to increase the area of the display area and add various functions thereto, studies have been conducted into a display apparatus having an area for adding various functions other than an image displaying function in the display area.

Generally, a display apparatus includes a light-emitting element, and a driving circuit that controls electrical signals applied to the light-emitting element. The driving circuit includes a thin-film transistor (TFT), a storage capacitor, and a plurality of lines.

In order to accurately control light emission and a luminescence level of the light-emitting element, the number of TFTs that are electrically connected to one light-emitting element has increased. Therefore, various studies are being actively conducted to achieve high integration of display apparatuses, and to reduce power consumption of the display apparatuses.

The above information disclosed in this Background section is for enhancement of understanding of the background of the present disclosure, and therefore, it may contain information that does not constitute prior art.

SUMMARY

In order to add various functions to display apparatuses, various suitable electronic components, for example, such as cameras and/or sensors, may be arranged in display areas of the display apparatuses.

One or more embodiments of the present disclosure are directed to a display apparatus having an expanded display area for enabling images to be displayed even at (e.g., in or on) an area in which an electronic component is arranged. One or more embodiments of the present disclosure are directed to a display apparatus, in which power consumption is reduced and display quality is improved. However, the present disclosure is not limited to the above aspects and features.

Additional aspects and features of the present disclosure will be set forth, in part, in the following description, and in part, will be apparent from the description, or may be learned by practicing one or more of the presented embodiments of the present disclosure.

According to one or more embodiments of the present disclosure, a display apparatus includes: a substrate including a first area, and a second area adjacent to the first area; a plurality of first pixel circuits at the first area of the substrate, each of the plurality of first pixel circuits including a silicon-based transistor, and an oxide-based transistor; a plurality of second pixel circuits at the second area of the substrate, the plurality of second pixel circuits including transistors; a first shielding layer at the first area, the first shielding layer including a shielding pattern overlapping with the silicon-based transistor of each of the plurality of first pixel circuits; and a second shielding layer at the second area, the second shielding layer including a first through-hole between adjacent second pixel circuits from among the plurality of second pixel circuits. The first shielding layer and the second shielding layer include different materials from each other.

In an embodiment, the shielding pattern of the first shielding layer may not overlap with the oxide-based transistor of each of the plurality of first pixel circuits.

In an embodiment, the shielding pattern of the first shielding layer may have an isolated shape.

In an embodiment, the first shielding layer may include an amorphous silicon material that is doped with impurities.

In an embodiment, the second shielding layer may include a metal material.

In an embodiment, the display apparatus may further include a buffer layer on the substrate, and located under the plurality of first pixel circuits and the plurality of second pixel circuits. The first shielding layer and the second shielding layer may be between the substrate and the buffer layer.

In an embodiment, the substrate may include a first base layer, a first barrier layer, a second base layer, and a second barrier layer that are sequentially stacked, and the first shielding layer and the second shielding layer may be between the second base layer and the second barrier layer.

In an embodiment, the silicon-based transistor of each of the plurality of first pixel circuits may include a semiconductor layer, and a gate electrode overlapping with a portion of the semiconductor layer, and a planar area of the shielding pattern of the first shielding layer may be greater than a planar area of the gate electrode of the silicon-based transistor.

In an embodiment, a thickness of the first shielding layer may be less than a thickness of the second shielding layer.

In an embodiment, each of the plurality of second pixel circuits may include a silicon-based transistor, and an oxide-based transistor.

In an embodiment, the display apparatus may further include a third shielding layer at the second area of the substrate, the third shielding layer including a material different from that of the second shielding layer.

In an embodiment, the third shielding layer may correspond to the second shielding layer, and may include a second through-hole overlapping with the first through-hole of the second shielding layer.

In an embodiment, the third shielding layer may include a same material as that of the first shielding layer.

According to one or more embodiments of the present disclosure, a method of manufacturing a display apparatus, includes: forming a plurality of first pixel circuits at a first area of a substrate, each of the plurality of first pixel circuits including a silicon-based transistor and an oxide-based transistor; forming a plurality of second pixel circuits at a second area of the substrate that is adjacent to the first area, the plurality of second pixel circuits including transistors; forming a first shielding layer at the first area, the first shielding layer including a shielding pattern overlapping with the silicon-based transistor of each of the plurality of first pixel circuits; forming a second shielding layer at the second area, the second shielding layer including a first through-hole between adjacent second pixel circuits from among the plurality of second pixel circuits; and forming a third shielding layer at the second area, the third shielding layer including a second through-hole overlapping with the first through-hole of the second shielding layer. The forming of the first shielding layer, the forming of the second shielding layer, and the forming of the third shielding layer use a same mask.

In an embodiment, the forming of the first shielding layer, the second shielding layer, and the third shielding layer by using the same mask may include: forming a first material layer on the substrate; forming a second material layer on the first material layer; forming a first photoresist pattern on the second material layer, the first photoresist pattern including a first portion having a first thickness, and a second portion having a second thickness greater than the first thickness; forming the first shielding layer and the third shielding layer by removing portions of the first material layer and the second material layer by using the first photoresist pattern as a mask; forming a second photoresist pattern by removing the first photoresist pattern by the first thickness; forming the second shielding layer by additionally removing a portion of the second material layer by using the second photoresist pattern as a mask; and removing the second photoresist pattern.

In an embodiment, the first portion of the first photoresist pattern may be at the first area of the substrate, and may have an isolated shape, and the second portion of the first photoresist pattern may be at the second area of the substrate, and may include a pattern hole overlapping with the first through-hole and the second through-hole.

In an embodiment, the forming of the first material layer may include: forming an amorphous silicon layer on the substrate; and doping impurities into the amorphous silicon layer.

In an embodiment, the second material layer may include a metal material.

In an embodiment, the second shielding layer and the third shielding layer may overlap with transistors of the second pixel circuits.

In an embodiment, the method may further include forming a buffer layer on the first shielding layer, the second shielding layer, and the third shielding layer.

Other aspects and features of the present disclosure may be better understood through the accompanying drawings, the detailed description, and the claims.

One or more embodiments of the present disclosure may be implemented by using a system, a method, a computer program, or any suitable combinations thereof.

BRIEF DESCRIPTION OF THE DRAWINGS

The above and other aspects and features of the present disclosure will become more apparent to those skilled in the art from the following detailed description of the embodiments with reference to the accompanying drawings, in which.

DETAILED DESCRIPTION

Figure 1:
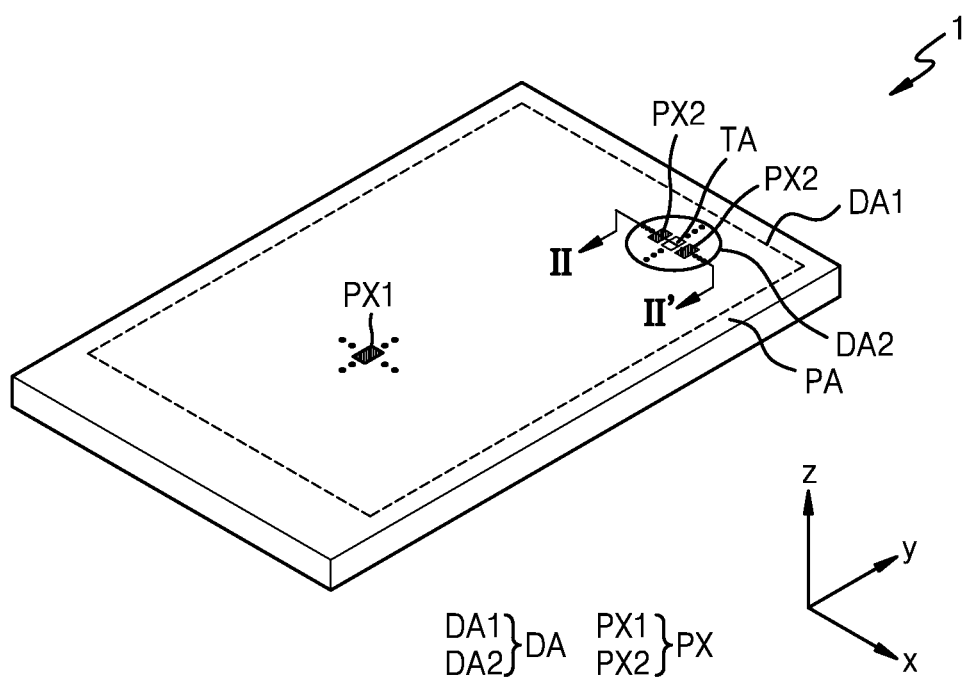
FIG. 1 is a schematic perspective view of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

As the present description allows for various suitable modifications and numerous embodiments, some embodiments are illustrated in the drawings and described in more detail in the written description. Thus, the effects, aspects, and features of one or more embodiments and methods of accomplishing the same will become apparent from the following detailed description of the one or more embodiments, taken in conjunction with the accompanying drawings. However, the presented embodiments may have various different forms, and should not be construed as being limited to the description set forth herein.

When an embodiment may be implemented differently, a certain process order may be performed differently from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The x-axis, the y-axis, and the z-axis shown in the drawings are not limited to three axes of the rectangular coordinate system, and may be interpreted in a broader sense. For example, the x-axis, the y-axis, and the z-axis may be perpendicular to or substantially perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" indicates only A, only B, or both A and B. Expressions such as "at least one of," when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus 1 according to an embodiment.

Referring to FIG. 1, the display apparatus 1 may include a display area DA, and a peripheral area PA around (e.g., to surround around a periphery of) the display area DA. The display apparatus 1 may provide an image through an array of a plurality of pixels PX arranged at (e.g., in or on) the display area DA. For example, the display area DA may include a first display area DA1 and a second display area DA2.

The pixels PX may be arranged at (e.g., in or on) the first display area DA1, and at (e.g., in or on) the second display area DA2. An array of the pixels PX arranged at (e.g., in or on) the first display area DA1 may be different from an array of the pixels PX arranged at (e.g., in or on) the second display area DA2. For example, because a transmission area TA may be between the pixels PX arranged at (e.g., in or on) the second display area DA2, the array of the pixels PX arranged at (e.g., in or on) the second display area DA2 may be different from the array of the pixels PX arranged at (e.g., in or on) the first display area DA1.

The display apparatus 1 may provide a first image by using light emitted from the pixels PX arranged at (e.g., in or on) the first display area DA1, and may provide a second image by using light emitted from the pixels PX arranged at (e.g., in or on) the second display area DA2. In some embodiments, the first image and the second image may be portions of the same image (e.g., portions of any one image) provided through the display area DA of the display apparatus 1. As another example, in some embodiments, the display apparatus 1 may provide a first image and a second image at the first display area DA1 and the second display area DA2, respectively, that are independent of each other.

The second display area DA2 may include the transmission area TA between the pixels PX thereof. The transmission area TA is an area through which light is transmitted, and an area at (e.g., in or on) which no pixels PX are arranged. The pixels PX may include first pixels PX1 arranged at (e.g., in or on) the first display area DA1, and second pixels PX2 arranged at (e.g., in or on) the second display area DA2.

The peripheral area PA is a non-display area that may not provide an image, and may entirely or partially surround (e.g., around a periphery of) the display area DA. A driver and/or the like that provides electrical signals or power to the display area DA may be arranged at (e.g., in or on) the peripheral area PA. Pads that are electrically connected to electronic elements, printed circuit boards, and/or the like may be arranged at (e.g., in or on) the peripheral area PA.

As illustrated in FIG. 1, the second display area DA2 may have a circular shape or an elliptical shape in a plan view (e.g., in a view from a direction that is perpendicular to or substantially perpendicular to a top surface of the relevant element, component, or layer). As another example, the second display area DA2 may have any suitable shape in a plan view, for example, such as a suitable polygonal shape such as a rectangular shape or a bar shape.

The second display area DA2 may be arranged within (e.g., inside) the first display area DA1, or may be arranged at a side (e.g., at one side) of the first display area DA1. As illustrated in FIG. 1, the second display area DA2 may be entirely surrounded (e.g., around a periphery thereof) by the first display area DA1. In some embodiments, the second display area DA2 may be partially surrounded (e.g., around a periphery thereof) by the first display area DA1. For example, the second display area DA2 may be partially surrounded (e.g., around a periphery thereof) by the first display area DA1 while being located at one corner of the first display area DA1.

A ratio of the second display area DA2 to the display area (e.g., the entire display area) DA may be less than a ratio of the first display area DA1 to the display area (e.g., the entire display area) DA. As illustrated in FIG. 1, the display apparatus 1 may include one second display area DA2, but the present disclosure is not limited thereto, and the display apparatus 1 may include two or more second display areas DA2 as needed or desired.

The display apparatus 1 may have a rectangular shape in a plan view, as illustrated in FIG. 1, but the present disclosure is not limited thereto. The display apparatus 1 may have various suitable shapes, for example, such as a polygonal shape, a polygon shape with round corners, a circular shape, an elliptical shape, and/or the like.

The display apparatus 1 may include (e.g., may be implemented as) a mobile phone, a tablet personal computer (PC), a notebook computer, a smart watch or a smart band worn on a user's wrist, an electronic device for a vehicle, and/or the like.

Figure 2:
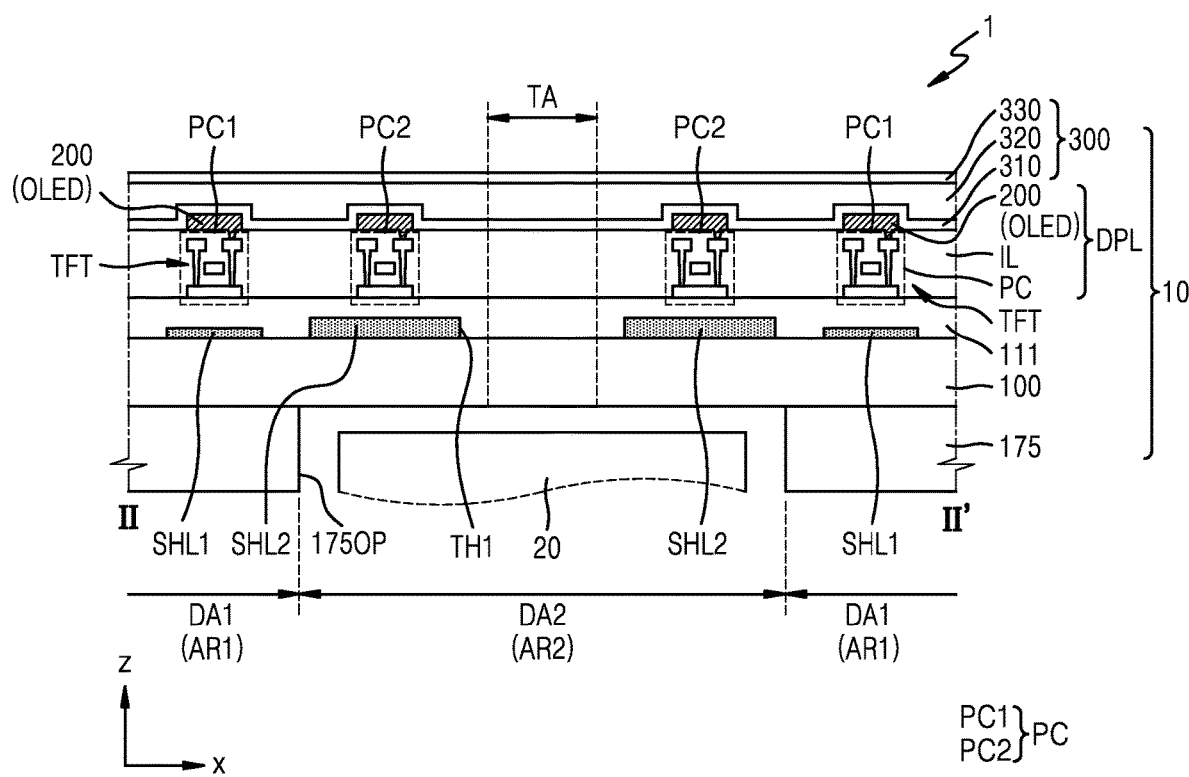
FIG. 2 is a schematic cross-sectional view of the display apparatus taken along the line II-II' of FIG. 1, according to an embodiment.

FIG. 2 is a schematic cross-sectional view of the display apparatus 1 taken along the line II-II' of FIG. 1, according to an embodiment.

Referring to FIG. 2, the display apparatus 1 may include a display panel 10, and an electronic component 20 arranged to overlap with the display panel 10.

The display panel 10 may include a substrate 100, a display layer DPL arranged above the substrate 100, and a thin-film encapsulation layer 300 arranged above the display layer DPL.

The substrate 100 may include a glass material, a ceramic material, a metal material, a plastic material, or a flexible and/or bendable material. The substrate 100 may have a single layer structure or a multiple layered structure including one or more of the above-described materials. In the case of the multiple layered structure, the substrate 100 may further include an inorganic layer. The substrate 100 may include a first area AR1 and a second area AR2. The first area AR1 and the second area AR2 of the substrate 100 may correspond to the first display area DA1 and the second display area DA2, respectively, of the display apparatus 1.

The display layer DPL may be arranged on a front surface (e.g., a top surface) of the substrate 100, and a lower protective film 175 may be arranged on a rear surface (e.g., a bottom surface) of the substrate 100. The lower protective film 175 may be attached to the rear surface of the substrate 100. An adhesive layer may be between the lower protective film 175 and the substrate 100. As another example, the lower protective film 175 may be directly formed on the rear surface of the substrate 100. In this case, an adhesive layer may not be located between the lower protective film 175 and the substrate 100.

The lower protective film 175 may support and protect the substrate 100. The lower protective film 175 may include an opening 175OP corresponding to the second display area DA2, or may not include the opening 175OP. The opening 175OP of the lower protective film 175 may be a concave portion formed by removing a portion of the lower protective film 175 in a thickness direction (e.g., in a z-axis direction) of the lower protective film 175. In some embodiments, the opening 175OP of the lower protective film 175 may be formed by completely removing the portion of the lower protective film 175 in the thickness direction of the lower protective film 175. In this case, the opening 175OP may have a through-hole shape as illustrated in FIG. 2, such that a portion of the substrate 100 may be exposed by the opening 175OP. In some embodiments, the opening 175OP of the lower protective film 175 may have a blind-hole shape, while a portion of the lower protective film 175 is partially removed in the thickness direction of the lower protective film 175, such that a portion of the substrate 100 is not exposed by the opening 175OP.

Because the opening 175OP may be provided in the lower protective film 175, the transmittance of the second display area DA2, for example, the light transmittance of the transmission area TA, may be improved. The lower protective film 175 may include an organic insulating material, for example, such as polyethylene terephthalate (PET) or polyimide (PI).

The display layer DPL may include a light-emitting diode as a light-emitting device 200. The light-emitting diode may include, for example, an organic light-emitting diode OLED. The organic light-emitting diode OLED may emit different colors of light, for example, a red light, a green light, or a blue light, according to a type of an organic material included therein. Also, the display layer DPL may include an insulating layer IL, and a pixel circuit PC electrically connected to the organic light-emitting diode OLED. The pixel circuit PC may include a plurality of first pixel circuits PC1 and a plurality of second pixel circuits PC2, which are arranged at (e.g., in or on) the first display area DA1 and the second display area DA2, respectively. The first pixel circuits PC1 and the second pixel circuits PC2 may each include a thin-film transistor TFT.

The light-emitting device 200 of the display layer DPL may emit light through an emission area, and the emission area may be defined as a pixel PX (e.g., see FIG. 1). Therefore, the pixel PX may be defined by an area capable of emitting, for example, a red light, a green light, or a blue light.

The second display area DA2 may include the transmission area TA at (e.g., in or on) which the thin-film transistor TFT and the organic light-emitting diode OLED are not arranged. The transmission area TA is an area through which light emitted from the electronic component 20 and/or directed to the electronic component 20 is transmitted. In the display panel 10, the transmittance of the transmission area TA may be about 30% or more, about 40% or more, about 50% or more, about 60% or more, about 75% or more, about 80% or more, about 85% or more, or about 90% or more.

The display layer DPL may be sealed with an encapsulation member. The encapsulation member may include a thin-film encapsulation layer including an inorganic insulating material and an organic insulating material, or may include a substrate including a rigid material, for example, such as encapsulation glass (Encap Glass). In some embodiments, the encapsulation member may include the thin-film encapsulation layer 300 as illustrated in FIG. 2. The thin-film encapsulation layer 300 may include at least one inorganic encapsulation layer and at least one organic encapsulation layer. In an embodiment, the thin-film encapsulation layer 300 may include first and second inorganic encapsulation layers 310 and 330, and an organic encapsulation layer 320 therebetween.

A first shielding layer SHL1 and a second shielding layer SHL2 may be arranged between the substrate 100 and the display layer DPL, for example, between the substrate 100 and the thin-film transistor TFT. The first shielding layer SHL1 may be arranged at (e.g., in or on) the first display area DA1, and the second shielding layer SHL2 may be arranged at (e.g., in or on) the second display area DA2. The second shielding layer SHL2 may include a first through-hole TH1 through which light emitted from the electronic component 20 or directed to the electronic component 20 passes. The first through-hole TH1 of the second shielding layer SHL2 may overlap with the transmission area TA.

The electronic component 20 may be located in the second display area DA2. The electronic component 20 may include an electronic element that uses light or sound. For example, the electronic element may include a sensor (e.g., a proximity sensor) that measures a distance, a sensor that recognizes a part of a user's body (e.g., a fingerprint, an iris, a face, and/or the like), a small lamp that outputs light, an image sensor (e.g., a camera) that captures an image, and/or the like. The electronic component that uses light may use light of various suitable wavelength bands, for example, such as visible light, infrared light, or ultraviolet light. The electronic element that uses sound may use ultrasonic waves or sounds of other suitable frequency bands. In some embodiments, the electronic component 20 may include one or more sub-components, for example, such as a light-emitting part and a light-receiving part. The light-emitting part and the light-receiving part may have an integrated structure, or a physically separated structure, and a pair of the light-emitting part and the light-receiving part may constitute one electronic component 20.

One electronic component 20 may be arranged in the second display area DA2, or a plurality of electronic components 20 may be arranged in the second display area DA2. When the display apparatus 1 includes a plurality of electronic components 20, the display apparatus 1 may include as many number of second display areas DA2 as the number of electronic components 20. For example, the display apparatus 1 may include a plurality of second display areas DA2 that are spaced apart from each other. In some embodiments, the electronic components 20 may be arranged in one second display area DA2. For example, the display apparatus 1 may include a bar-type shaped second display area DA2, and a plurality of electronic components 20 may be spaced apart from each other in a length direction of the second display area DA2.

Although a case in which the display panel 10 includes the organic light-emitting diode OLED as the light-emitting device 200 has been described above with reference to FIG. 2, the display panel 10 according to the present disclosure is not limited thereto. In another embodiment, the display panel 10 may include an inorganic light-emitting display panel or an inorganic electroluminescence (EL) display panel including an inorganic light-emitting diode. The inorganic light-emitting diode may include a PN junction diode including an inorganic semiconductor-based material. When a voltage is applied to the PN junction diode in a forward direction, holes and electrons may be injected and recombined with each other to generate energy. The PN junction diode may convert the generated energy into light energy to emit light of a suitable color (e.g., light of a predetermined or certain color). The inorganic light-emitting diode may have a width of several micrometers to several hundred micrometers. In some embodiments, the inorganic light-emitting diode may be referred to as a micro LED. In another embodiment, the display panel 10 may include a quantum dot light-emitting display panel including a quantum dot light-emitting device, an organic/inorganic composite light-emitting display panel, and/or the like.

Figure 3:
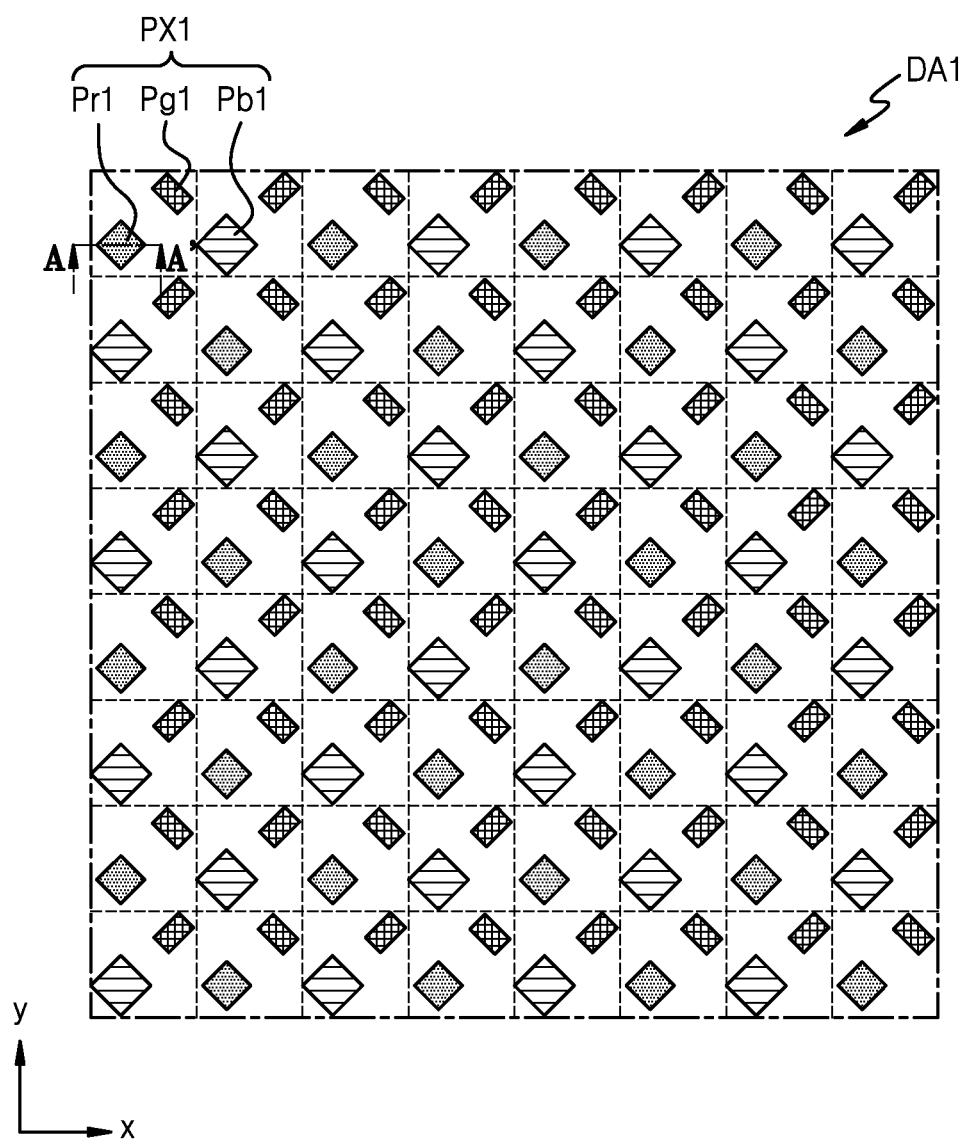
FIG. 3 is a schematic plan view of a portion of a first display area in the display apparatus, according to an embodiment.

FIG. 3 is a schematic plan view of a portion of the first display area DA1 in the display apparatus, according to an embodiment.

Referring to FIG. 3, a plurality of first pixels PX1 may be arranged at (e.g., in or on) the first display area DA1. The first pixels PX1 may include a first red pixel Pr1, a first green pixel Pg1, and a first blue pixel Pb1. In some embodiments, as illustrated in FIG. 3, the first red pixel Pr1, the first green pixel Pg1, and the first blue pixel Pb1 may be arranged in an RGBG type arrangement (e.g., in a PENTILE® arrangement, PENTILE® being a duly registered trademark). In another embodiment, the first red pixel Pr1, the first green pixel Pg1, and the first blue pixel Pb1 may be arranged in a stripe type or any other suitable arrangement.

The first red pixel Pr1, the first green pixel Pg1, and the first blue pixel Pb1 may have different sizes (or different widths) from each other. For example, the first blue pixel Pb1 may be larger than the first red pixel Pr1 and the first green pixel Pg1, and the first red pixel Pr1 may be larger than the first green pixel Pg1. In some embodiments, the first green pixel Pg1 may have a rectangular shape (e.g., in a plan view), and the first green pixels Pg1 that are adjacent to each other may extend in different directions from each other.

Figure 4:
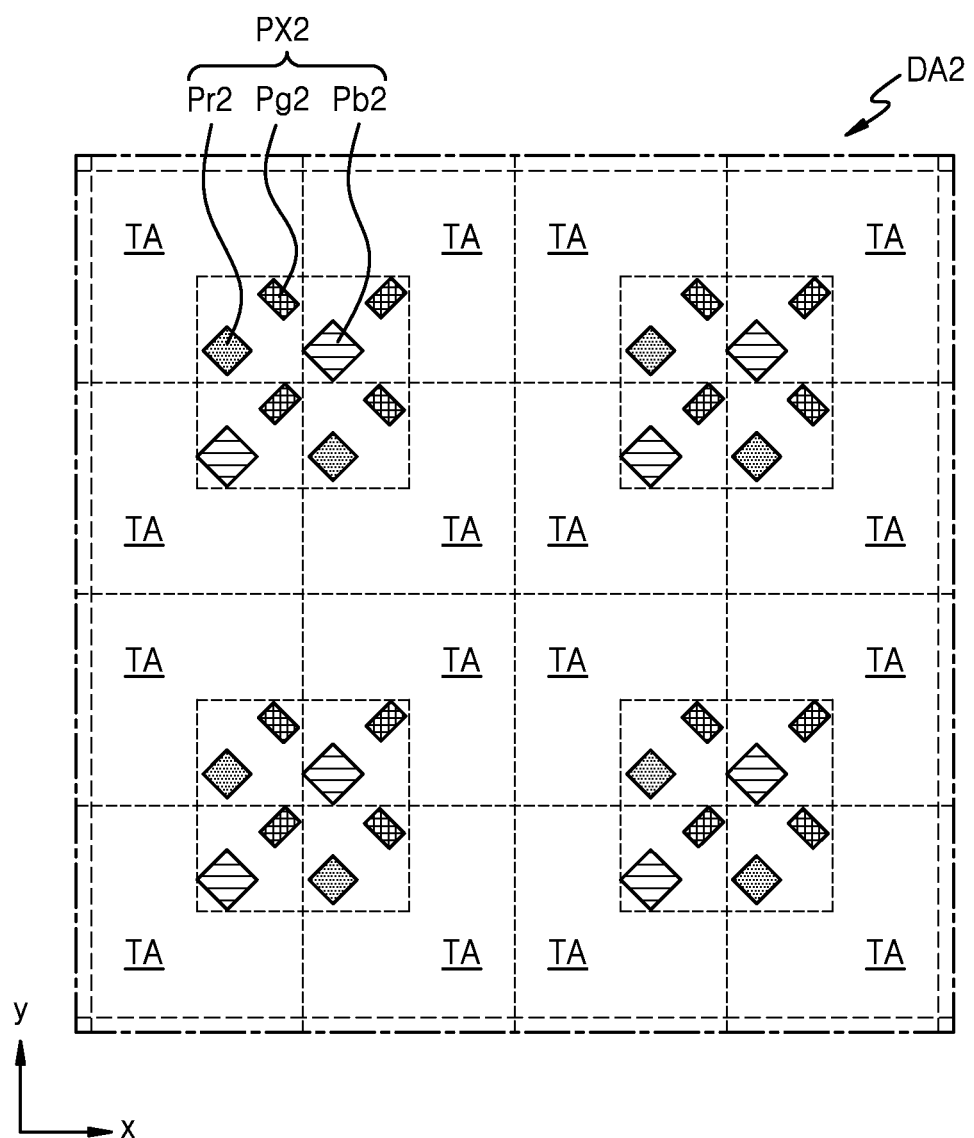
FIG. 4 is a schematic plan view of a portion of a second display area in the display apparatus, according to an embodiment.

FIG. 4 is a schematic plan view of a portion of the second display area DA2 in the display apparatus, according to an embodiment.

Referring to FIG. 4, a plurality of second pixels PX2 may be arranged at (e.g., in or on) the second display area DA2. The second pixels PX2 may include a second red pixel Pr2, a second green pixel Pg2, and a second blue pixel Pb2. In some embodiments, the second red pixel Pr2, the second green pixel Pg2, and the second blue pixel Pb2 may be arranged in an RGBG type arrangement (e.g., in a PENTILE® arrangement). In another embodiment, the second red pixel Pr2, the second green pixel Pg2, and the second blue pixel Pb2 may be arranged in a stripe type or any other suitable arrangement.

The second display area DA2 may include the transmission areas TA. At (e.g., in or on) the second display area DA2, the transmission areas TA may be arranged to be adjacent to the second pixels PX2. For example, the second pixels PX2 may include at least two second pixels PX2 that are spaced apart from each other with the transmission areas TA therebetween. Because the second display area DA2 includes the transmission areas TA, the number of second pixels PX2 per unit area in the second display area DA2 may be less than the number of first pixels PX1 per the same or substantially the same sized unit area in the first display area DA1.

As an example, FIG. 4 illustrates that eight second pixels PX2 constitute one group (e.g., one grouping of the second pixels PX2), and adjacent groups are arranged with the transmission areas TA therebetween. Also, the one group may be at least partially surrounded (e.g., around a periphery thereof) by four transmission areas TA formed in an L-shape. However, the present disclosure is not limited thereto, and the number of second pixels PX2 included in the one group may be variously modified in design according to a resolution (e.g., a desired or suitable resolution) of the second display area DA2. Also, a planar shape (e.g., a shape when viewed from a direction that is perpendicular to or substantially perpendicular to a top surface of the relevant element, component, or layer) of the transmission area TA arranged around the one group may also be variously modified in design as needed or desired.

The number of lines arranged per unit area in the second display area DA2 may be less than the number of lines arranged per the same or substantially the same sized unit area in the first display area DA1. The lines may include signal lines configured to provide electrical signals to the first pixel circuit PC1 and/or the second pixel circuit PC2 (e.g., see FIG. 2), or power lines configured to provide power to the first pixel circuit PC1 and/or the second pixel circuit PC2 (e.g., see FIG. 2). In more detail, because the number of second pixel circuits PC2 arranged per unit area in the second display area DA2 is less than the number of first pixel circuits PC1 arranged per the same or substantially the same sized unit area in the first display area DA1, the number of lines arranged at (e.g., in or on) the second display area DA2 may also be less than the number of lines arranged at (e.g., in or on) the first display area DA1. Also, the lines arranged at (e.g., in or on) the first display area DA1 may extend to bypass (e.g., may extend around) the second display area DA2, so as to not be arranged at (e.g., in or on) the second display area DA2. Thus, the number of lines arranged at (e.g., in or on) the second display area DA2 may be reduced or minimized to reduce a size of the area of a region occupied by the lines in the second display area DA2, and to increase the transmission areas TA (e.g., to increase a size and/or number of the transmission areas TA) of the second display area DA2. Therefore, the light transmittance of the second display area DA2 may be improved.

Figure 5:
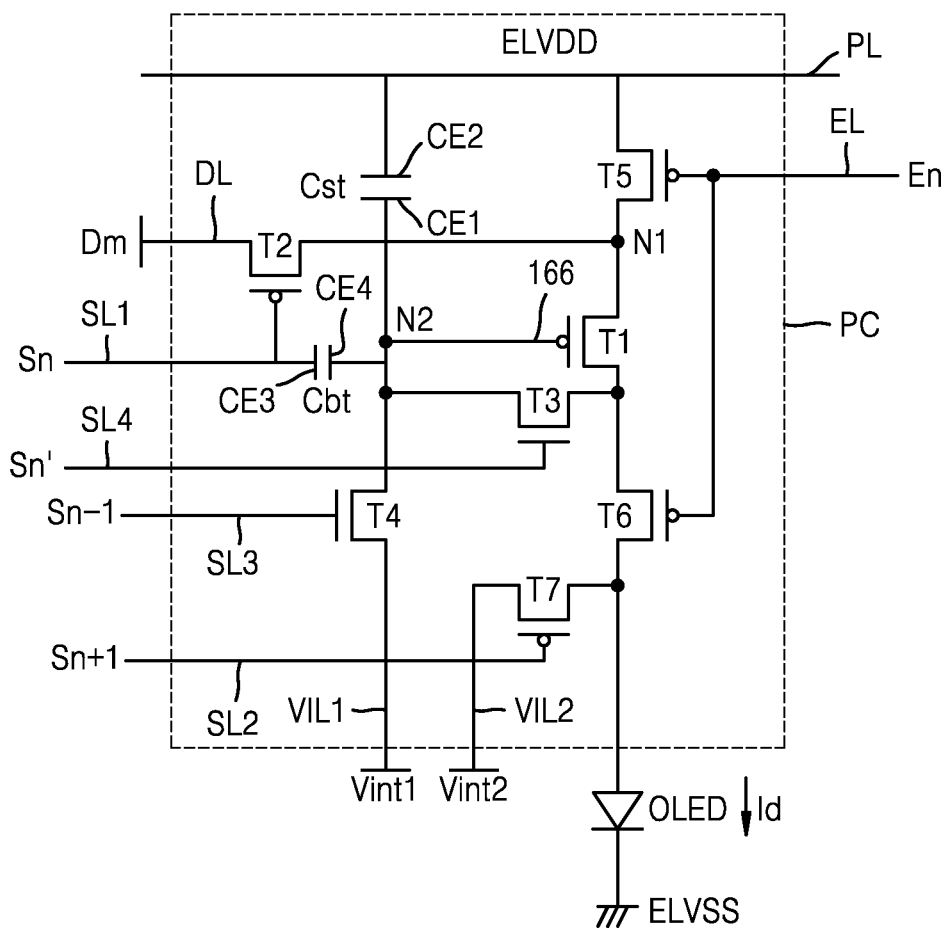
FIG. 5 is an equivalent circuit diagram of a pixel circuit in the display apparatus, according to an embodiment.

FIG. 5 is an equivalent circuit diagram of a pixel circuit PC in the display apparatus, according to an embodiment.

Referring to FIG. 5, the pixel circuit PC may include first to seventh transistors T1, T2, T3, T4, T5, T6, and T7, a first capacitor Cst, and a second capacitor Cbt. The pixel circuit PC may be connected to a plurality of signal lines, first and second initialization voltage lines VIL1 and VIL2, and a power supply voltage line PL. The signal lines may include a data line DL, a first scan line SL1, a second scan line SL2, a third scan line SL3, a fourth scan line SL4, and an emission control line EL. In another embodiment, at least one of the signal lines, the first and second initialization voltage lines VIL1 and VIL2, and/or the power supply voltage line PL may be shared by neighboring (e.g., by adjacent) pixel circuits PC.

The power supply voltage line PL may be configured to transmit a first power supply voltage ELVDD to the first transistor T1. The first initialization voltage line VIL1 may be configured to transmit, to the pixel circuit PC, a first initialization voltage Vint1 for initializing the first transistor T1. The second initialization voltage line VIL2 may be configured to transmit, to the pixel circuit PC, a second initialization voltage Vint2 for initializing an organic light-emitting diode OLED.

As an example, FIG. 5 illustrates that the third transistor T3 and the fourth transistor T4 from among the first to seventh transistors T1 to T7 are implemented as n-channel metal-oxide-semiconductor field effect transistors (n-channel MOSFETs or NMOSs), and the other remaining transistors from among the first to seventh transistors T1 to T7 are implemented as p-channel MOSFETs (PMOSs).

The first transistor T1 may be electrically connected to the power supply voltage line PL through the fifth transistor T5, and may be electrically connected to the organic light-emitting diode OLED through the sixth transistor T6. The first transistor T1 may serve as a driving transistor. The first transistor T1 may be configured to receive a data signal Dm according to a switching operation of the second transistor T2, and supply a driving current Id to the organic light-emitting diode OLED.

The second transistor T2 may serve as a switching transistor, and may be connected to the first scan line SL1 and the data line DL. The second transistor T2 may be connected to the power supply voltage line PL through the fifth transistor T5. The second transistor T2 may be turned on according to a first scan signal Sn received through the first scan line SL1, and may perform a switching operation to transmit the data signal Dm transmitted from the data line DL to a first node N1.

The third transistor T3 may serve as a compensation transistor, and may be connected to the fourth scan line SL4. The third transistor T3 may be connected to the organic light-emitting diode OLED through the sixth transistor T6. The third transistor T3 may be turned on according to a fourth scan signal Sn' received through the fourth scan line SL4, and may diode-connect the first transistor T1.

The fourth transistor T4 may serve as a first initialization transistor, and may be connected to the first initialization voltage line VIL1. The fourth transistor T4 may be connected to the third scan line SL3, which may be a previous scan line, and may be turned on according to a third scan signal Sn−1, which may be a previous scan signal received through the third scan line SL3. The fourth transistor T4 may transmit the first initialization voltage Vint1 from the first initialization voltage line VIL1 to a gate electrode of the first transistor T1, so as to initialize a voltage of the gate electrode of the first transistor T1.

The fifth transistor T5 may serve as an operation control transistor, and the sixth transistor T6 may serve as an emission control transistor. The fifth transistor T5 and the sixth transistor T6 may be connected to the emission control line EL, and may be concurrently (e.g., simultaneously) turned on according to an emission control signal En received through the emission control line EL to form a current path, so that the driving current Id flows from the power supply voltage line PL toward the organic light-emitting diode OLED.

The seventh transistor T7 may serve as a second initialization transistor, and may be connected to the second initialization voltage line VIL2. The seventh transistor T7 may be connected to the second scan line SL2, which may be a next scan line, and may be turned on according to a fourth scan signal Sn+1, which may be a next scan signal, received through the second scan line SL2. The seventh transistor T7 may transmit the second initialization voltage Vint2 from the second initialization voltage line VIL2 to the organic light-emitting diode OLED, so as to initialize the organic light-emitting diode OLED. However, the present disclosure is not limited thereto, and in some embodiments, the seventh transistor T7 may be omitted.

The first capacitor Cst may include a first electrode CE1 and a second electrode CE2. The first electrode CE1 may be connected to the gate electrode of the first transistor T1, and the second electrode CE2 may be connected to the power supply voltage line PL. The first capacitor Cst may be configured to store and maintain or substantially maintain a voltage corresponding to a difference between voltages of the power supply voltage line PL and the gate electrode of the first transistor T1, so that the voltage applied to the gate electrode of the first transistor T1 is maintained or substantially maintained.

The second capacitor Cbt may include a third electrode CE3 and a fourth electrode CE4. The third electrode CE3 may be connected to the first scan line SL1 and a gate electrode of the second transistor T2. The fourth electrode CE4 may be connected to the gate electrode of the first transistor T1 and the first electrode CE1 of the first capacitor Cst. The second capacitor Cbt may serve as a boosting capacitor. When the first scan signal Sn of the first scan line SL1 is a voltage for turning off the second transistor T2, the second capacitor Cbt may boost the voltage of a second node N2 so that a voltage (e.g., a black voltage) for displaying black is reduced.

The organic light-emitting diode OLED may include a pixel electrode and an opposite electrode, and the opposite electrode may be configured to receive a second power supply voltage ELVSS. The organic light-emitting diode OLED may be configured to receive the driving current Id from the first transistor T1, and may emit light to display an image.

An operation of each pixel circuit PC according to an embodiment is described in more detail hereinafter.

During a first initialization period, when the third scan signal Sn−1 is supplied through the third scan line SL3, the fourth transistor T4 may be turned on in response to the third scan signal Sn−1, and the first transistor T1 may be initialized by the first initialization voltage Vint1 supplied from the first initialization voltage line VIL1.

During a data programming period, when the first scan signal Sn and the fourth scan signal Sn' are supplied through the first scan line SL1 and the fourth scan line SL4, respectively, the second transistor T2 and the third transistor T3 may be turned on in response to the first scan signal Sn and the fourth scan signal Sn'. In this case, the first transistor T1 may be diode-connected by the turned-on third transistor T3, and may be biased in a forward direction. A voltage obtained by compensating for a threshold voltage (Vth) of the first transistor T1 in the data signal Dm supplied from the data line DL may be applied to the gate electrode of the first transistor T1. The first power supply voltage ELVDD and the compensation voltage may be applied to both terminals of the first capacitor Cst, and charges corresponding to the voltage difference between both terminals of the first capacitor Cst may be stored in the first capacitor Cst.

During an emission period, the fifth transistor T5 and the sixth transistor T6 may be turned on by the emission control signal En supplied from the emission control line EL. The driving current Id occurs according to the voltage difference between the voltage of the gate electrode of the first transistor T1 and the first power supply voltage ELVDD, and the driving current Id may be supplied to the organic light-emitting diode OLED through the sixth transistor T6.

During a second initialization period, when the second scan signal Sn+1 is supplied through the second scan line SL2, the seventh transistor T7 may be turned on in response to the second scan signal Sn+1, and the organic light-emitting diode OLED may be initialized by the second initialization voltage Vint2 supplied from the second initialization voltage line VIL2.

In an embodiment, each of the first to seventh thin-film transistors T1 to T7 may include a silicon-based transistor including a silicon-containing semiconductor layer. In another embodiment, at least one of the first to seventh transistors T1 to T7 may include an oxide-based transistor including an oxide semiconductor, and the others thereof may include a silicon-based transistor including a silicon semiconductor. For example, the first transistor T1 that directly influences the brightness of the display apparatus may be provided as a silicon-based transistor including a silicon-based semiconductor layer including polycrystalline silicon with high reliability. In this case, a high-resolution display apparatus may be implemented.

Because the oxide semiconductor may have high carrier mobility and low leakage current, a voltage drop may not be great even when a driving time is long. In other words, because a color change of an image due to the voltage drop may not be great even during low frequency driving, the low frequency driving may be enabled. As such, the oxide semiconductor may have a small leakage current. Therefore, when at least one of the third transistor T3 and/or the fourth transistor T4 that are connected to the gate electrode of the first transistor T1 includes the oxide semiconductor, the leakage current that may flow into the gate electrode of the first transistor T1 may be prevented or reduced, and power consumption may also be reduced.

For convenience of description, a case in which the first transistor T1, the second transistor T2, the fifth transistor T5, the sixth transistor T6, and the seventh transistor T7 are provided as silicon-based thin-film transistors including a silicon semiconductor, and the third transistor T3 and the fourth transistor T4 are provided as oxide-based transistors including an oxide semiconductor will be described in more detail below as an example.

Figure 6:
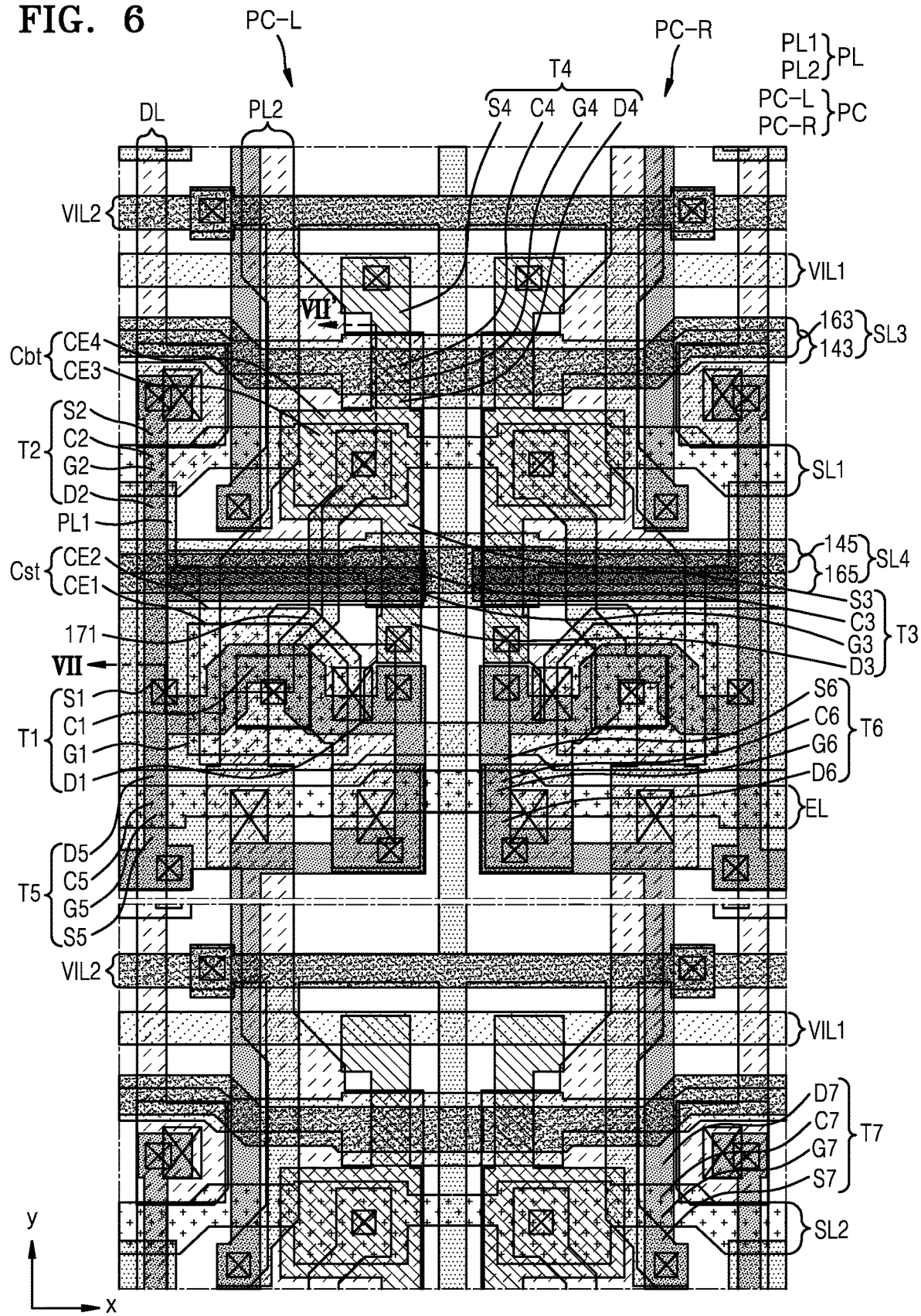
FIG. 6 is a schematic layout diagram of a pair of pixel circuits in the display apparatus, according to an embodiment.

FIG. 6 is a schematic layout diagram of a pair of pixel circuits in the display apparatus, according to an embodiment. The pixel circuits may be arranged to form rows and columns, and FIG. 6 illustrates a pair of pixel circuits PC arranged at (e.g., in or on) the same row of adjacent columns. A pixel circuit PC-L arranged on the left side of FIG. 6 and a pixel circuit PC-R arranged on the right side of FIG. 6 are bilaterally symmetrical or substantially symmetrical with each other.

Referring to FIG. 6, the pixel circuit PC of the display apparatus, according to an embodiment, may include a first scan line SL1, a second scan line SL2, a third scan line SL3, a fourth scan line SL4, an emission control line EL, a first initialization voltage line VIL1, and a second initialization voltage line VIL2, which extend in a first direction (e.g., an x-direction). The pixel circuit PC may further include a data line DL and a power supply voltage line PL, which extend in a second direction (e.g., a y-direction) crossing the first direction (e.g., the x-direction). The power supply voltage line PL may include a first power supply voltage line PL1 and a second power supply voltage line PL2.

Further, the pixel circuit PC may include a first transistor T1, a second transistor T2, a third transistor T3, a fourth transistor T4, a fifth transistor T5, a sixth transistor T6, a seventh transistor T7, a first capacitor Cst, and a second capacitor Cbt.

The second scan line SL2 may be the first scan line SL1 of a next row. In other words, the first scan line SL1 illustrated in FIG. 6 may be the second scan line SL2 of a previous row. Both the seventh transistor T7 connected to the pixel circuit of the previous row and arranged at (e.g., in or on) the pixel area of the current row and the seventh transistor T7 connected to the pixel circuit of the current row and arranged at (e.g., in or on) the pixel area of the next row are illustrated in FIG. 6. Hereinafter, for convenience of illustration and description, the seventh transistor T7 arranged at (e.g., in or on) the pixel area of the current row will be described in more detail as an example.

The semiconductor layers of the first transistor T1, the second transistor T2, the fifth transistor T5, the sixth transistor T6, and the seventh transistor T7 are arranged at (e.g., in or on) the same layer as each other, and include the same or substantially the same material as each other. For example, the semiconductor layers may include polycrystalline silicon. The semiconductor layers of the first transistor T1, the second transistor T2, the fifth transistor T5, the sixth transistor T6, and the seventh transistor T7 may be connected to each other, and may be bent in various suitable shapes.

Each of the semiconductor layers of the first transistor T1, the second transistor T2, the fifth transistor T5, the sixth transistor T6, and the seventh transistor T7 may include a channel region, and a source region and a drain region on opposite sides of the channel region. For example, each of the source region and the drain region may be doped with impurities, and the impurities may include N-type impurities or P-type impurities. The source region and the drain region may correspond to a source electrode and a drain electrode, respectively. The source region and the drain region may be changed with each other according to characteristics of the transistor. Hereinafter, the terms "source region" and "drain region" may be used instead of the source electrode and the drain electrode, respectively.

The first transistor T1 may include a first semiconductor layer and a first gate electrode G1. The first semiconductor layer may include a first channel region C1, and a first source region S1 and a first drain region D1 on opposite sides of the first channel region C1. Because the first semiconductor layer has a curved shape, the first channel region C1 may be longer than other channel regions C2 to C7 of the second to seventh transistors T2 to T7. For example, the first semiconductor layer may be bent a plurality of times, such as in an "S" shape, an "M" shape, or a "W" shape, thereby forming a long channel length in a narrow space. Because the first channel region C1 is formed to be long, a driving range of the gate voltage applied to the first gate electrode G1 may be widened. Therefore, a gradation of light emitted from the organic light-emitting diode OLED may be controlled more precisely, thereby improving display quality. In some embodiments, the first semiconductor layer may have a straight shape instead of a bent shape. The first gate electrode G1 may be provided to overlap with the first channel region C1 in an isolated type.

The first capacitor Cst may be arranged to overlap with the first transistor T1. The first capacitor Cst may include a first electrode CE1 and a second electrode CE2. The first gate electrode G1 may function not only as the control electrode of the first transistor T1, but also as the first electrode CE1 of the first capacitor Cst. In other words, the first gate electrode G1 and the first electrode CE1 may be integrally formed with each other. The second electrode CE2 of the first capacitor Cst may be provided to overlap with the first electrode CE1 with an insulating layer therebetween. In this case, the insulating layer may serve as a dielectric layer of the first capacitor Cst.

The second transistor T2 may include a second semiconductor layer and a second gate electrode G2. The second semiconductor layer may include a second channel region C2, and a second source region S2 and a second drain region D2 on opposite sides of the second channel region C2. The second source region S2 may be connected to the data line DL, and the second drain region D2 may be connected to the first source region S1. The second gate electrode G2 may be provided as a portion of the first scan line SL1.

The fifth transistor T5 may include a fifth semiconductor layer and a fifth gate electrode G5. The fifth semiconductor layer may include a fifth channel region C5, and a fifth source region S5 and a fifth drain region D5 on opposite sides of the fifth channel region C5. The fifth source region S5 may be electrically connected to the first power supply voltage line PL1, and the fifth drain region D5 may be connected to the first source region S1. The fifth gate electrode G5 may be provided as a portion of the emission control line EL.

The sixth transistor T6 may include a sixth semiconductor layer and a sixth gate electrode G6. The sixth semiconductor layer may include a sixth channel region C6, and a sixth source region S6 and a sixth drain region D6 on opposite sides of the sixth channel region C6. The sixth source region S6 may be connected to the first drain region D1, and the sixth drain region D6 may be electrically connected to a pixel electrode (e.g., see 210 of FIG. 7) of the organic light-emitting diode OLED. The sixth gate electrode G6 may be provided as a portion of the emission control line EL.

The seventh transistor T7 may include a seventh semiconductor layer and a seventh gate electrode G7. The seventh semiconductor layer may include a seventh channel region C7, and a seventh source region S7 and a seventh drain region D7 on opposite sides of the seventh channel region C7. The seventh source region S7 may be electrically connected to the second initialization voltage line VIL2, and the seventh drain region D7 may be connected to the sixth drain region D6. The seventh gate electrode G7 may be provided as a portion of the second scan line SL2.

A first interlayer insulating layer (e.g., see 117 of FIG. 7) may be arranged on the first, second, fifth, sixth, and seventh transistors T1, T2, T5, T6, and T7, each including a silicon semiconductor, and the third and fourth transistors T3 and T4, each including an oxide semiconductor, may be arranged on the first interlayer insulating layer 117.

Each of the semiconductor layers of the third transistor T3 and the fourth transistor T4 may include a channel region, and a source region and a drain region on opposite sides of the channel region. For example, the source region and the drain region may be formed by adjusting the carrier concentration of the oxide semiconductor to make them conductive. For example, the source regions and the drain regions of the third transistor T3 and the fourth transistor T4 may be formed by increasing the carrier concentration through plasma treatment using hydrogen (H)-based gas, fluorine (F)-based gas, or a combination thereof on the oxide semiconductor. The source region and the drain region may correspond to a source electrode and a drain electrode, respectively. Hereinafter, the terms "source region" and "drain region" may be used instead of the source electrode and the drain electrode, respectively.

The third transistor T3 may include a third semiconductor layer including an oxide semiconductor, and a third gate electrode G3. The third semiconductor layer may include a third channel region C3, and a third source region S3 and a third drain region D3 on opposite sides of the third channel region C3. The third source region S3 may be bridged to the first gate electrode G1 through a node connection line 171. Further, the third source region S3 may be connected to a fourth drain region D4 of the fourth transistor T4 arranged at (e.g., in or on) the same layer. The third drain region D3 may be electrically connected to the first semiconductor layer of the first transistor T1 and the sixth semiconductor layer of the sixth transistor T6. The third gate electrode G3 may be provided as a portion of the fourth scan line SL4.

The fourth transistor T4 may include a fourth semiconductor layer including an oxide semiconductor, and a fourth gate electrode G4. The fourth semiconductor layer may include a fourth channel region C4, and a fourth source region S4 and a fourth drain region D4 on opposite sides of the fourth channel region C4. The fourth source region S4 may be electrically connected to the first initialization voltage line VIL1, and the fourth drain region D4 may be bridged to the first gate electrode G1 through the node connection line 171. The fourth gate electrode G4 may be provided as a portion of the third scan line SL3.

A third gate insulating layer (e.g., see 118 of FIG. 7) may be arranged to correspond to the channel region between the third semiconductor layer and the third gate electrode G3, and to correspond to the channel region between the fourth semiconductor layer and the fourth gate electrode G4.

The third electrode CE3 of the second capacitor Cbt may be provided as a portion of the first scan line 133, and may be connected to the second gate electrode G2 of the second transistor T2. The fourth electrode CE4 of the second capacitor Cbt may be arranged to overlap with the third electrode CE3, and may include an oxide semiconductor. The fourth electrode CE4 may be provided at (e.g., in or on) the same layer as those of the third semiconductor layer of the third transistor T3 and the fourth semiconductor layer of the fourth transistor T4, and may be an area between the third semiconductor layer and the fourth semiconductor layer. As another example, the fourth electrode CE4 may extend from the fourth semiconductor layer. As another example, the fourth electrode CE4 may extend from the third semiconductor layer.

The node connection line 171 may be electrically connected to the first electrode CE1 and the third semiconductor layer of the third transistor T3. The second electrode CE2 may be electrically connected to the first power supply voltage line PL1, and the first power supply voltage line PL1 may be electrically connected to the second power supply voltage line PL2. The first power supply voltage line PL1 and the second power supply voltage line PL2 may extend in the second direction (e.g., the y-direction). The second electrode CE2 may extend in the first direction (e.g., the x-direction), and may transmit the first power supply voltage ELVDD in the first direction (e.g., the x-direction). Therefore, a plurality of the first power supply voltage lines PL1, a plurality of the second power supply voltage lines PL2, and a plurality of the second electrodes CE2 at (e.g., in or on) the display area DA may form a mesh structure.

In an embodiment, some of the lines may include two conductive layers that are arranged at (e.g., in or on) different layers from each other. For example, the third scan line SL3 may include a lower scan line 143 and an upper scan line 163 that are arranged at (e.g., in or on) different layers from each other. The lower scan line 143 may be arranged at (e.g., in or on) the same layer as that of the second electrode CE2 of the first capacitor Cst, and may include the same or substantially the same material as that of the second electrode CE2 of the first capacitor Cst. The lower scan line 143 may be arranged to at least partially overlap with the upper scan line 163. The lower scan line 143 and the upper scan line 163 correspond to a portion of the third gate electrode of the third transistor T3. Therefore, the third transistor T3 may have a double gate structure including control electrodes above and below the semiconductor layer, respectively.

The fourth scan line SL4 may include a lower scan line 145 and an upper scan line 165 that are arranged at (e.g., in or on) different layers from each other. The lower scan line 145 may be arranged at (e.g., in or on) the same layer as that of the second electrode CE2 of the first capacitor Cst, and may include the same or substantially the same material as that of the second electrode CE2 of the first capacitor Cst. The lower scan line 145 may be arranged to at least partially overlap with the upper scan line 165. The lower scan line 145 and the upper scan line 165 correspond to a portion of the fourth gate electrode G4 of the fourth transistor T4. Therefore, the fourth transistor T4 may have a double gate structure including control electrodes above and below the semiconductor layer, respectively.

For example, the first initialization voltage line VIL1 and the second initialization voltage line VIL2 may be arranged at (e.g., in or on) different layers from each other. The first initialization voltage line VIL1 may be arranged at (e.g., in or on) the same layer as that of the second electrode CE2 of the first capacitor Cst, and may include the same or substantially the same material as that of the second electrode CE2 of the first capacitor Cst. The second initialization voltage line VIL2 may be arranged at (e.g., in or on) the same layer as that of the first power supply voltage line PL1, and may include the same or substantially the same material as that of the first power supply voltage line PL1.

Figure 7:
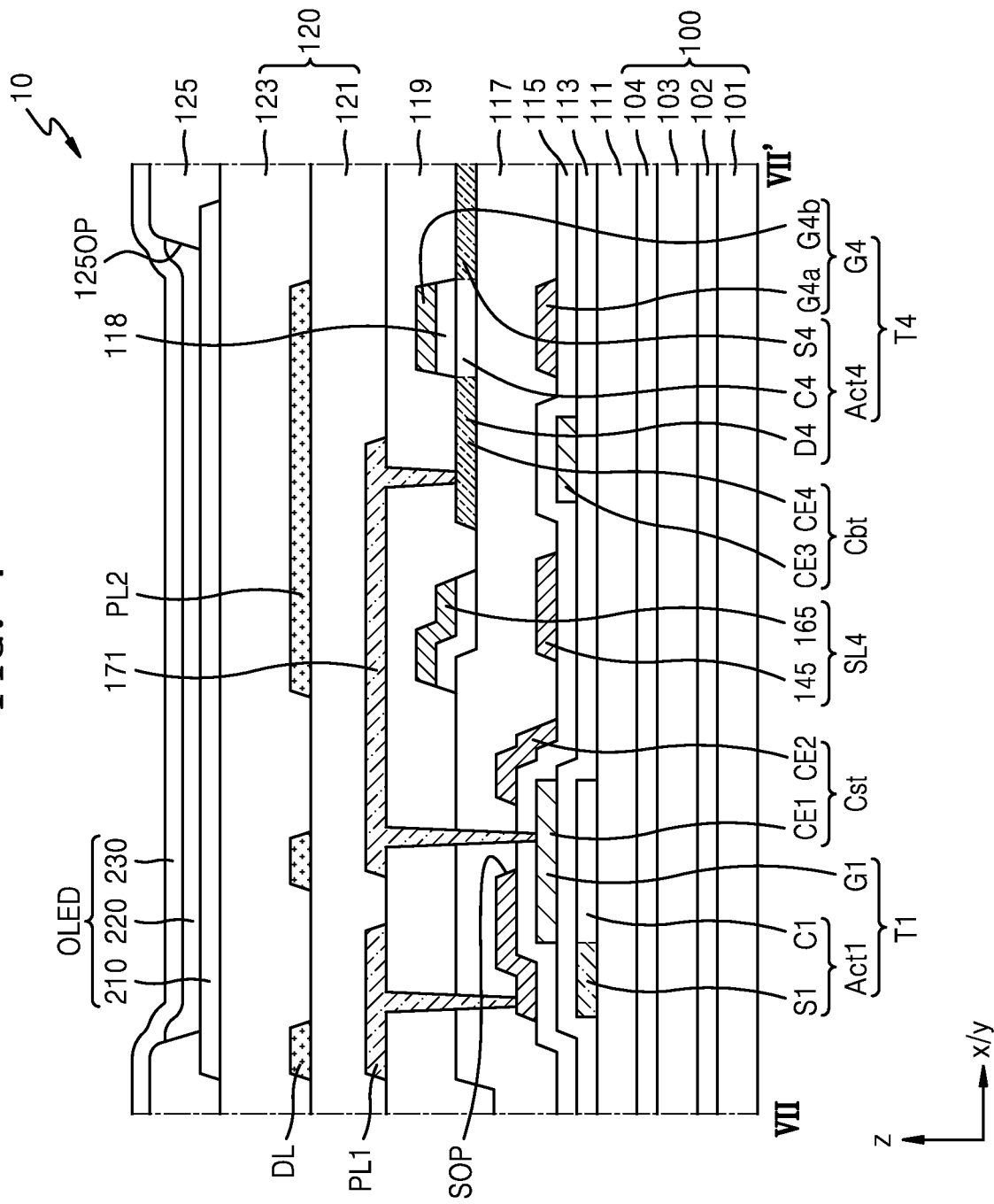
FIG. 7 is a schematic cross-sectional view of a portion of the display apparatus taken along the line VII-VII' of FIG. 6, according to an embodiment.

FIG. 7 is a schematic cross-sectional view of a portion of the display apparatus taken along line the VII-VII' of FIG. 6, according to an embodiment.

A stacked structure of the display panel 10 according to an embodiment will be described with reference to FIG. 7. For convenience, the following description with reference to FIG. 7 will focus mainly on the first transistor T1 and the fourth transistor T4. The stacked structure of the second transistor T2, the fifth transistor T5, the sixth transistor T6, and the seventh transistor T7 may be the same or substantially the same as (or similar to) that of the first transistor T1, and the stacked structure of the third transistor T3 may be the same or substantially the same as (or similar to) that of the fourth transistor T4.

Referring to FIG. 7, a substrate 100 may include a glass material, a ceramic material, a metal material, a plastic material, or a flexible and/or bendable material. When the substrate 100 includes a flexible and/or bendable material, the substrate 100 may include a polymer resin, for example, such as polyethersulphone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The substrate 100 may have a single layer structure or a multiple layered structure including one or more of the above-described materials. In the case of the multiple layered structure, the substrate 100 may further include an inorganic layer. For example, the substrate 100 may include a first base layer 101, a first barrier layer 102, a second base layer 103, and a second barrier layer 104, which are sequentially stacked. Each of the first base layer 101 and the second base layer 103 may include a polymer resin. Each of the first barrier layer 102 and the second barrier layer 104 may be a barrier layer for preventing or substantially preventing the penetration of external foreign substances. Each of the first barrier layer 102 and the second barrier layer 104 may have a single layer structure or a multiple layered structure including an inorganic material, for example, such as silicon nitride ($SiN_x$) or silicon oxide ($SiO_x$).

A buffer layer 111 may be arranged on the substrate 100. The buffer layer 111 may increase a smoothness of the upper surface of the substrate 100, and may include an oxide layer, for example, such as silicon oxide ($SiO_x$), and/or a nitride layer, for example, such as silicon nitride ($SiN_x$), or silicon oxynitride ($SiO_xN_y$).

Semiconductor layers of the first transistor T1, the second transistor T2, the fifth transistor T5, the sixth transistor T6, and the seventh transistor T7 may be arranged on the buffer layer 111. The first semiconductor layer Act1 of the first transistor T1, which is a portion of the semiconductor layer, is illustrated in FIG. 7.

A first gate insulating layer 113 may be arranged on the first semiconductor layer Act1. The first gate insulating layer 113 may include an inorganic material including an oxide or a nitride. For example, the first gate insulating layer 113 may include at least one selected from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO).

Gate electrodes of the first transistor T1, the second transistor T2, the fifth transistor T5, the sixth transistor T6, and the seventh transistor T7 may be arranged on the first gate insulating layer 113. The first gate electrode G1 of the first transistor T1 is illustrated in FIG. 7. Further, the first scan line (e.g., see SL1 of FIG. 6) and the emission control line (e.g., see EL of FIG. 6) may be arranged on the first gate insulating layer 113. The third electrode CE3 of the second capacitor Cbt, which is a portion of the first scan line SL1, is illustrated in FIG. 7.

The first gate electrode G1 of the first transistor T1 may be provided in an isolated type. The first gate electrode G1 of the first transistor T1 may function not only as the control electrode of the first transistor T1, but also as the first electrode CE1 of the first capacitor Cst.

The first gate electrode G1 of the first transistor T1 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The first gate electrode G1 of the first transistor T1 may include a single layer structure or a multiple layered structure.

A second gate insulating layer 115 may be arranged on the first gate electrode G1 of the first transistor T1. The second gate insulating layer 115 may include an inorganic material including an oxide or a nitride. For example, the second gate insulating layer 115 may include at least one selected from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO).

The second electrode CE2 may be arranged on the second gate insulating layer 115 to overlap with the first electrode CE1. The second electrode CE2 may include an opening SOP. The opening SOP may be defined by removing a portion of the second electrode CE2, and may have a closed shape. The second gate insulating layer 115 may serve as a dielectric layer of the first capacitor Cst.

The second electrode CE2 of the first capacitor Cst may include a single layer structure or a multiple layered structure including at least one selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The first initialization voltage line (e.g., see VIL1 of FIG. 6), the lower scan line (e.g., see 143 of FIG. 6) of the third scan line (see SL3 of FIG. 6), and the lower scan line 145 of the fourth scan line SL4 may be arranged on the second gate insulating layer 115, and may include the same or substantially the same material as that of the second electrode CE2 of the first capacitor Cst. A portion of the lower scan line 143 of the third scan line SL3 overlapping with the fourth semiconductor layer Act4 may be a lower gate electrode G4a of the fourth transistor T4.

A first interlayer insulating layer 117 may be arranged on the second electrode CE2 of the first capacitor Cst. The first interlayer insulating layer 117 may include an inorganic material including an oxide or a nitride. For example, the first interlayer insulating layer 117 may include at least one selected from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO).

An oxide-based semiconductor layer including an oxide semiconductor may be arranged on the first interlayer insulating layer 117. The oxide-based semiconductor layer may include a Zn oxide-based material, for example, such as Zn oxide, In—Zn oxide, Ga—In—Zn oxide, and/or the like. In some embodiments, the oxide-based semiconductor layer may include In—Ga—Zn—O (IGZO), In—Sn—Zn—O (ITZO), or In—Ga—Sn—Zn—O (IGTZO) semiconductor, in which a metal such as indium (In), gallium (Ga), or tin (Sn) is included in ZnO.

The oxide-based semiconductor layer may include a channel region, a source region, and a drain region of each of the third transistor T3 and the fourth transistor T4. The fourth semiconductor layer Act4 of the fourth transistor T4 is illustrated in FIG. 7.

The oxide-based semiconductor layer may include the fourth electrode CE4 of the second capacitor Cbt. For example, the fourth electrode CE4 may be provided as a portion of the fourth semiconductor layer Act4 of the fourth transistor T4. The second gate insulating layer 115 and the first interlayer insulating layer 117 may be arranged between the third electrode CE3 and the fourth electrode CE4 of the second capacitor Cbt, and the second gate insulating layer 115 and the first interlayer insulating layer 117 may function as the dielectric layer of the second capacitor Cbt.

An upper gate electrode G4b of the fourth transistor T4 may be provided on the oxide-based semiconductor layer. The upper gate electrode G4b of the fourth transistor T4 may be a portion of the upper scan line (e.g., see 163 of FIG. 6) of the third scan line (e.g., see SL3 of FIG. 6) overlapping with the fourth semiconductor layer Act4. In other words, the fourth transistor T4 may have a double gate structure in which control electrodes are provided above and below the semiconductor layer, respectively. The upper gate electrode G4b of the fourth transistor T4 may be arranged on the third gate insulating layer 118, and may include a single layer structure or a multiple layered structure including at least one selected from among molybdenum (Mo), copper (Cu), and titanium (Ti).

The third gate insulating layer 118 may include an inorganic material including an oxide or a nitride. For example, the third gate insulating layer 118 may include at least one selected from among silicon oxide (SiO$_2$), silicon nitride (SiN$_x$), silicon oxynitride (SiO$_x$N$_y$), aluminum oxide (Al$_2$O$_3$), titanium oxide (TiO$_2$), tantalum oxide (Ta$_2$O$_5$), hafnium oxide (HfO$_2$), and zinc oxide (ZnO).

The second initialization voltage line (e.g., see VIL2 of FIG. 6), the upper scan line (e.g., see 163 of FIG. 6) of the third scan line (e.g., see SL3 of FIG. 6), and the upper scan line 165 of the fourth scan line SL4 may be arranged on the third gate insulating layer 118.

The second interlayer insulating layer 119 may cover the fourth transistor T4. The second interlayer insulating layer 119 may be arranged on the upper gate electrode G4b of the fourth transistor T4. A first power supply voltage line PL1, a node connection line 171, and the like may be arranged on the second interlayer insulating layer 119.

The second interlayer insulating layer 119 may include an inorganic material including an oxide or a nitride. For example, the second interlayer insulating layer 119 may include at least one selected from among silicon oxide (SiO$_2$), silicon nitride (SiN$_x$), silicon oxynitride (SiO$_x$N$_y$), aluminum oxide (Al$_2$O$_3$), titanium oxide (TiO$_2$), tantalum oxide (Ta$_2$O$_5$), hafnium oxide (HfO$_2$), and zinc oxide (ZnO).

Each of the first power supply voltage line PL1 and the node connection line 171 may include a material having a high conductivity, for example such as a metal or a conductive oxide. For example, each of the first power supply voltage line PL1 and the node connection line 171 may include a single layer structure or a multiple layered structure including at least one selected from among aluminum (Al), copper (Cu), and titanium (Ti).

The first power supply voltage line PL1 may be connected to the second electrode CE2 of the first capacitor Cst through contact holes formed in the first interlayer insulating layer 117 and the second interlayer insulating layer 119.

One end of the node connection line 171 may be connected to the first gate electrode G1 through contact holes passing through the second interlayer insulating layer 119, the first interlayer insulating layer 117, and the second gate insulating layer 115. Another end (e.g., an opposite end) of the node connection line 171 may be connected to the oxide-based semiconductor layer, for example, the fourth electrode CE4 of the second capacitor Cbt or the fourth semiconductor layer Act4, through a contact hole passing through the second interlayer insulating layer 119.

The fourth electrode CE4 of the second capacitor Cbt may be connected to the node connection line 171, so as to be electrically connected to the first gate electrode G1. Therefore, when the first scan signal Sn that is supplied to the first scan line SL1 is a turned off level, the second capacitor Cbt may increase the voltage of the second node (e.g., see N2 of FIG. 2) so that the black gradation is clearly expressed.

A first planarization layer 121 may be arranged on the first power supply voltage line PL1 and the node connection line 171. A data line DL and a second power supply voltage line PL2 may be arranged on the first planarization layer 121. A second planarization layer may be arranged on the first planarization layer 121 to cover the first power supply voltage line PL1 and the node connection line 171.

The first planarization layer 121 and the second planarization layer 123 may include an organic material, for example, such as acryl, benzocyclobutene (BCB), polyimide, or hexamethyldisiloxane (HMDSO). As another example, each of the first planarization layer 121 and the second planarization layer 123 may include an inorganic material. The first planarization layer 121 and the second planarization layer 123 may serve as a protective layer for covering the first to seventh transistors T1 to T7, and may be provided so that the upper surfaces of the first planarization layer 121 and the second planarization layer 123 are planarized or substantially planarized. Each of the first planarization layer 121 and the second planarization layer 123 may include a single layer structure or a multiple layered structure.

A pixel defining layer 125 may be arranged on the second planarization layer 123. Because the pixel defining layer 125 has an opening 125OP corresponding to each pixel, or in other words, an opening 125OP that exposes a central portion of at least the pixel electrode 210, the pixel defining layer 125 may define a pixel. Further, the pixel defining layer 125 may increase a distance between an edge of the pixel electrode 210 and the opposite electrode 230 over the pixel electrode 210, and thus, may prevent or substantially prevent arcs and/or the like from occurring at the edge of the pixel electrode 210. The pixel defining layer 125 may include, for example, an organic material such as polyimide or hexamethyldisiloxane (HMDSO).

An intermediate layer 220 of the organic light-emitting diode OLED may include a low molecular weight material or a high molecular weight material. When the intermediate layer 220 includes a low molecular weight material, the intermediate layer 220 may have a single layer structure or a multiple layered structure including a hole injection layer (HIL), a hole transport layer (HTL), an emission layer (EML), an electron transport layer (ETL), and an electron injection layer (EIL). The intermediate layer 220 may include various suitable organic materials, for example, such as copper phthalocyanine (CuPc), N,N'-di(naphthalene-1-yl)-N,N'-diphenyl-benzidine (NPB), and/or tris-8-hydroxy-quinoline aluminum (Alq3). These layers may be formed by vacuum deposition.

When the intermediate layer 220 includes a high molecular weight material, the intermediate layer 220 may have a structure including an HTL and an EML. In this case, the HTL may include poly(3,4-ethylenedioxythiophene (PEDOT), and the EML may include a poly-phenylenevinylene (PPV)-based polymer or a polyfluorene-based polymer. The intermediate layer 220 may be formed by screen printing, inkjet printing, or laser induced thermal imaging (LITI).

However, the intermediate layer 220 is not necessarily limited thereto. The intermediate layer 220 may have various suitable structures. For example, the intermediate layer 220 may include an integrated layer over the pixel electrodes 210, or may include one or more layers that are patterned to correspond to the pixel electrodes 210.

The opposite electrode 230 may be integrally formed with respect to a plurality of organic light-emitting diodes OLED, and may correspond to the pixel electrodes 210.

The organic light-emitting diodes OLED may be damaged (e.g., may be easily damaged) by external moisture and/or oxygen. Accordingly, a thin-film encapsulation layer or a sealing substrate may be arranged on the organic light-emitting diodes OLED to cover the organic light-emitting diodes OLED, so as to protect the organic light-emitting diodes OLED. The thin-film encapsulation layer may cover the display area DA, and may extend to the outside of the display area DA. The thin-film encapsulation layer may include at least one inorganic encapsulation layer including an inorganic material, and at least one organic encapsulation layer including an organic material. In some embodiments, the thin-film encapsulation layer may have a structure in which a first inorganic encapsulation layer, an organic encapsulation layer, and a second inorganic encapsulation layer are stacked. The sealing substrate may be arranged to face the substrate 100, and may be bonded to the substrate 100 at (e.g., in or on) the peripheral area PA by a sealing member, for example, such as sealant or frit.

A spacer may be further provided on the pixel defining layer 125, so as to prevent or substantially prevent a mask dent. Various suitable functional layers, for example, such as a polarizing layer for reducing external light reflection, a black matrix, a color filter, and/or a touch screen layer including a touch electrode, may be provided on the thin-film encapsulation layer.

The cross-sectional structure of FIG. 7 may correspond to a portion of the first pixel circuit (e.g., see PC1 of FIG. 2) arranged at (e.g., in or on) the first display area (e.g., see DA1 of FIG. 2), and/or a portion of the second pixel circuit (e.g., see PC2 of FIG. 2) arranged at (e.g., in or on) the second display area (e.g., see DA2 of FIG. 2). Therefore, FIG. 7 does not illustrate the first shielding layer (e.g., see SHL1 of FIG. 2) arranged at (e.g., in or on) the first display area DA1 and the second shielding layer (e.g., see SHL2 of FIG. 2) arranged at (e.g., in or on) the second display area DA2, and the structure and arrangement of the first shielding layer SHL1 and the second shielding layer SHL2 will be described in more detail below with reference to FIGS. 8 to 13.

Figure 8:
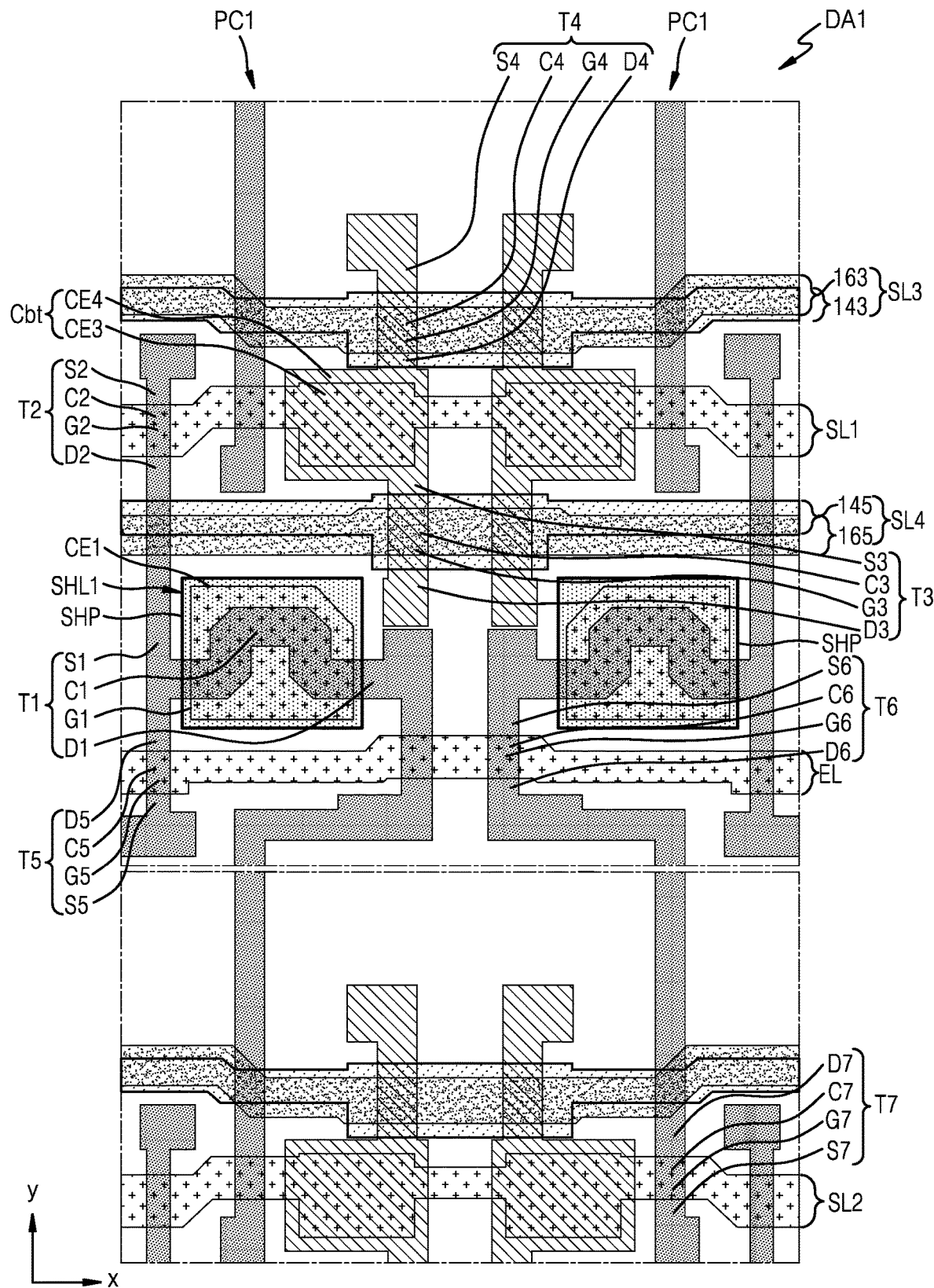
FIG. 8 is a schematic layout diagram of a portion of a pair of pixel circuits in the display apparatus, according to an embodiment.

FIG. 8 is a schematic layout diagram of a portion of a pair of pixel circuits in the display apparatus, according to an embodiment.

FIG. 8 illustrates a portion of a first pixel circuit PC1 arranged at (e.g., in or on) a first display area DA1 from among the pixel circuits PC of the display apparatus 1, and the first shielding layer SHL1 and the surrounding structure thereof are mainly illustrated in FIG. 8.

Referring to FIG. 8, the first shielding layer SHL1 may be arranged at (e.g., in or on) the first display area DA1, and may be arranged to overlap with the first pixel circuit PC1 arranged at (e.g., in or on) the first display area DA1. The first shielding layer SHL1 may include shielding patterns SHP overlapping with a silicon-based transistor of the first pixel circuit PC1. For example, each of the shielding patterns SHP may overlap with the first transistor T1 of the first pixel circuit PC1. In this case, the shielding pattern SHP may not overlap with second to seventh transistors T2, T3, T4, T5, T6, and T7 other than the first transistor T1. Further, the shielding patterns SHP may not overlap with the oxide-based transistors of the first pixel circuit PC1. For example, the shielding patterns SHP may not overlap with the third transistor T3 and the fourth transistor T4 of the first pixel circuit PC1.

For example, a proximity sensor or a sensor configured to recognize a part of a user's body may be arranged at (e.g., in or on) the first display area DA1. In this case, light used by these sensors may be passed through the first pixel circuit PC1. Thus, the shielding pattern SHP of the first shielding layer SHL1 may not entirely overlap with the first pixel circuit PC1, and may partially overlap with the first pixel circuit PC1.

The shielding patterns SHP of the first shielding layer SHL1 may be formed in an isolated type (e.g., an isolated shape). Although FIG. 8 illustrates that the shielding pattern SHP has a rectangular shape in a plan view, the present disclosure is not limited thereto. For example, the shielding pattern SHP may have various suitable shapes, such as a polygon shape, a polygonal shape with rounded corners, a circular shape, or an elliptical shape.

The planar area of each of the shielding patterns SHP of the first shielding layer SHL1 may be greater (e.g., may be larger) than the planar area of the gate electrode of the silicon-based transistor overlapping with each of the shielding patterns SHP. For example, the area of each of the shielding patterns SHP of the first shielding layer SHL1 may be greater (e.g., may be larger) than the area of the first gate electrode G1 of the first transistor T1.

Figure 9:
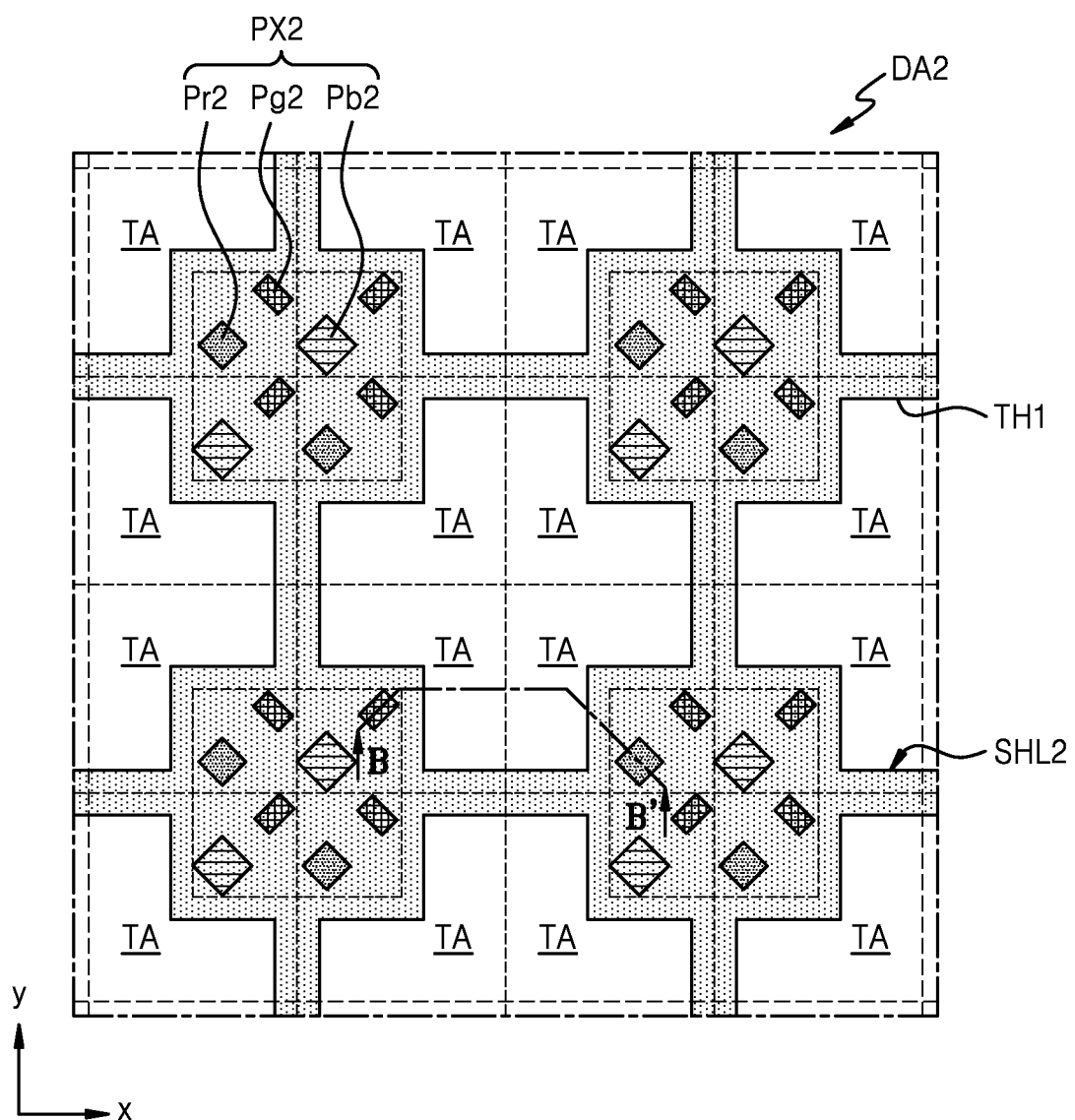
FIG. 9 is a schematic plan view of a portion of a second display area in the display apparatus, according to an embodiment.

FIG. 9 is a schematic plan view of a portion of the second display area DA2 in the display apparatus, according to an embodiment. FIG. 9 illustrates the arrangement of the second shielding layer SHL2.

Referring to FIG. 9, the second shielding layer SHL2 may be arranged at (e.g., in or on) the second display area DA2, and may be arranged to overlap with the second pixels PX2 of the second display area DA2. The light-emitting devices (e.g., see 200 of FIG. 2) that emit light through the second pixels PX2 and the second pixel circuits (e.g., see PC2 of FIG. 2) that are electrically connected to the light-emitting devices may be arranged to overlap with the second shielding layer SHL2. Further, a plurality of lines configured to apply electrical signals to the second pixel circuits PC2 may also be arranged to overlap with the second shielding layer SHL2.

The second shielding layer SHL2 may include a first through-hole TH1 overlapping with the transmission area TA of the second display area DA2. Because the second shielding layer SHL2 includes the first through-hole TH1, a deterioration in the transmittance of light passing through the transmission area TA may be reduced (e.g., may be significantly reduced).

The planar shape of the second shielding layer SHL2 may be variously changed according to the shape and/or arrangement of the second pixels PX2 and the transmission area TA.

Figure 10:
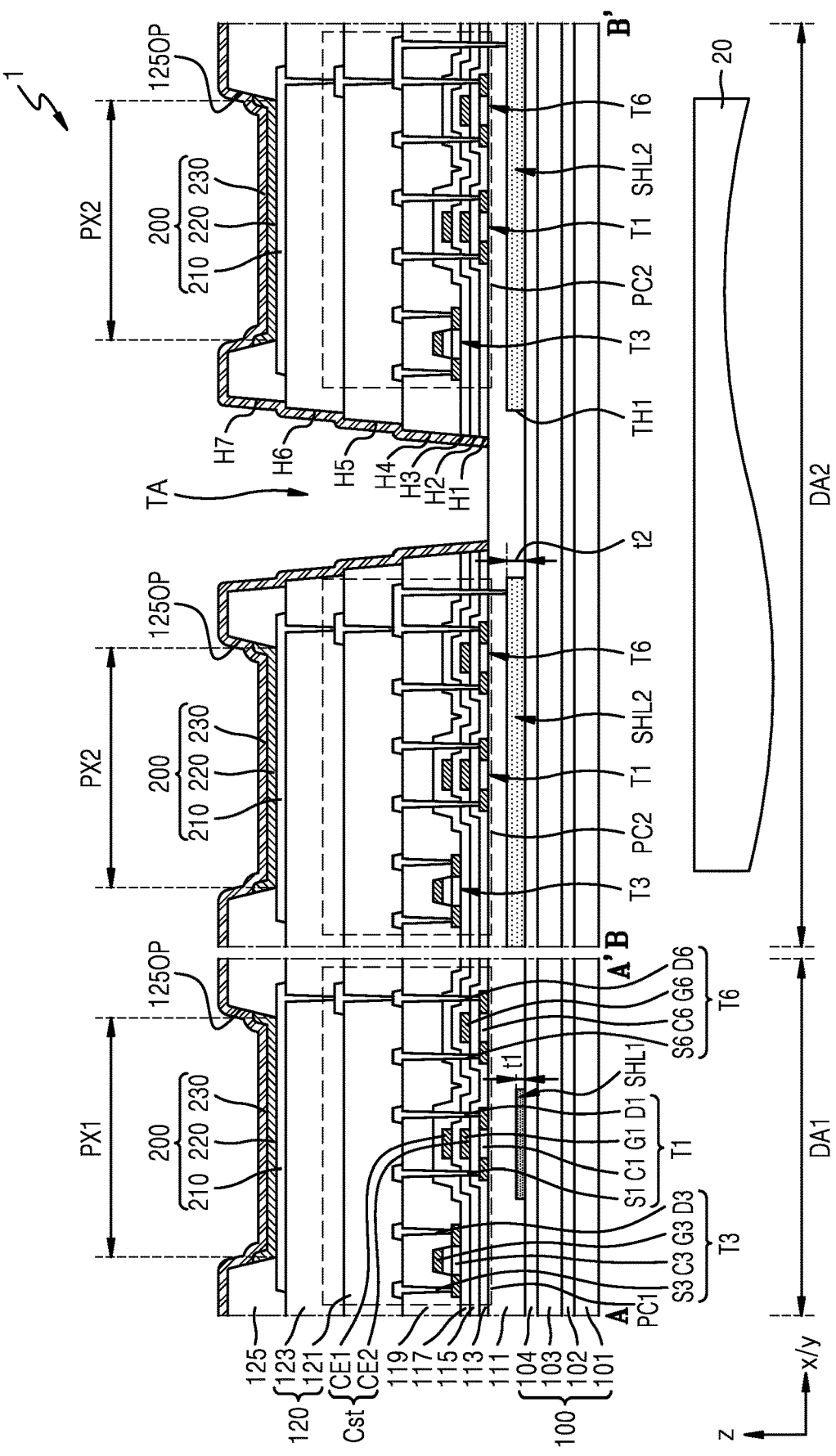
FIG. 10 is a schematic cross-sectional view of a portion of the display apparatus according to an embodiment.

FIG. 10 is a schematic cross-sectional view of a portion of the display apparatus according to an embodiment. FIG. 10 illustrates a cross-section of a portion of the display apparatus taken along the line A-A' of FIG. 3, and a cross-section of a portion of the display apparatus taken along the line B-B' of FIG. 9. Because the stacked structure of the display apparatus has been described above with reference to FIG. 7, redundant description thereof may not be repeated.

First, referring to the first display area DA1 of FIG. 10, the first pixel circuit PC1 may be arranged at (e.g., in or on) the first display area DA1. The first pixel circuit PC1 may include a silicon-based transistor, and an oxide-based transistor. FIG. 10 illustrates the first transistor T1 and the sixth transistor T6, which are silicon-based transistors, and the third transistor T3, which is an oxide-based transistor. The light-emitting device 200 may be electrically connected to the first pixel circuit PC1. The light-emitting device 200 may receive a driving current from the first pixel circuit PC1, and may emit light from the first pixel PX1.

The first shielding layer SHL1 may be arranged under (e.g., underneath) the first pixel circuit PC1. For example, the first shielding layer SHL1 may be arranged between the substrate 100 and the buffer layer 111. The first shielding layer SHL1 may include amorphous silicon, which will be described in more detail below. For example, the first shielding layer SHL1 may include amorphous silicon that is doped with impurities. For example, the first shielding layer SHL1 may include a p-type amorphous silicon that is doped with impurities, such as aluminum (Al), boron (B), or indium (In) in pure amorphous silicon. As another example, the first shielding layer SHL1 may include an n-type amorphous silicon that is doped with impurities, such as phosphorus (P), arsenic (As), and/or antimony (Sb) in pure amorphous silicon. Because the first shielding layer SHL1 includes amorphous silicon that is doped with impurities, the first shielding layer SHL1 may have a relatively low light transmittance.

Light that is incident from the outside of the display apparatus 1 and/or light that is emitted from the element (e.g., the electronic component) of the display apparatus 1 may be reflected from an interface of each layer constituting the display apparatus 1, and may undesirably reach the first transistor T1 of the first pixel circuit PC1. In this case, the device characteristics of the first transistor T1, for example, the voltage-current characteristics thereof, may be changed, and the degree of change in the voltage-current characteristics of the first transistor T1 may also be changed according to the intensity of light reaching the first transistor T1, the time of exposure to light, and/or the like. This may interfere with precise control of the gradation of light emitted from the light-emitting device 200. In other words, as the voltage-current characteristics of the first transistor T1 changes, it may be difficult to accurately apply a desired driving current to the light-emitting device 200, and the light-emitting device 200 may emit light having an undesired gradation. In this case, spots and/or the like may be visually recognized by the user, and thus, the display quality may be deteriorated.

However, according to one or more embodiments of the present disclosure, it may be possible to reduce or significantly reduce the influence of light on the first transistor T1 by providing the first shielding layer SHL1 that overlaps with the first transistor T1. In this case, the first transistor T1 may have stable or substantially stable voltage-current characteristics, thereby preventing or reducing a deterioration in display quality.

When a negative voltage is applied to both of the signal lines (e.g., the emission control line and the fourth scan line in FIG. 6) that are arranged at (e.g., in or on) opposite sides of the first transistor T1, positive charges may be collected at an interface of the substrate 100, for example, the interface of the second base layer 103. Therefore, an electric field may be formed, and negative charges may be collected under the first semiconductor layer A1 of the first transistor T1. As a result, the first transistor T1 may be affected, and the voltage-current characteristics of the first transistor T1 may be changed.

According to one or more embodiments of the present disclosure, the first shielding layer SHL1 may be provided so as to reduce or significantly reduce this effect. The first shielding layer SHL1 between the first transistor T1 and the substrate 100 may shield or cancel an electric field formed when specific charges are collected at the interface of the substrate 100. In this case, the first transistor T1 may have stable or substantially stable voltage-current characteristics, thereby preventing or reducing a deterioration in display quality.

The first shielding layer SHL1 may effectively shield an electric field, which may affect the first transistor T1, by employing amorphous silicon instead of a metal material having a relatively large number of free electrons. Further, the first shielding layer SHL1 including amorphous silicon may be relatively electrically stable without receiving a separate constant voltage, and thus, a separate contact for receiving the constant voltage may not be used or required. In this case, the area in which the first shielding layer SHL1 is arranged may be reduced or significantly reduced, and the first shielding layer SHL1 may be arranged only under the first transistor T1.

According to an embodiment, a thickness t1 of the first shielding layer SHL1 may be different from a thickness t2 of the second shielding layer SHL2. For example, the thickness t1 of the first shielding layer SHL1 may be less than the thickness t2 of the second shielding layer SHL2. Unlike the second shielding layer SHL2, because the first shielding layer SHL1 may partially overlap with the first pixel circuit PC1, a step difference increases when the thickness t1 of the first shielding layer SHL1 is great, and thus, cracks may occur in insulating layers located on the first shielding layer SHL1. To prevent or substantially prevent the cracks from occurring, the thickness t1 of the first shielding layer SHL1 may be formed to be sufficiently small, and may be less than the thickness t2 of the second shielding layer SHL2.

Next, referring to the second display area DA2 of FIG. 10, the second pixel circuit PC2 may be arranged at (e.g., in or on) the second display area. The second pixel circuit PC2 may include a silicon-based transistor, and an oxide-based transistor. FIG. 10 illustrates the first transistor T1 and the sixth transistor T6, which are silicon-based transistors, and the third transistor T3, which is an oxide-based transistor. The light-emitting device 200 may be electrically connected to the second pixel circuit PC2. The light-emitting device 200 may receive a driving current from the second pixel circuit PC2, and may emit light from the second pixel PX2.

The electronic component 20 may be arranged in the second display area DA2. A transmission area TA through which light emitted from the electronic component 20 or directed to the electronic component 20 is transmitted may be arranged at (e.g., in or on) the second display area DA2. Adjacent second pixel circuits PC2 may be spaced apart from each other with the transmission area TA therebetween. Each of the insulating layers on the substrate 100 may include a hole formed in the transmission area TA. For example, the first gate insulating layer 113, the second gate insulating layer 115, the first interlayer insulating layer 117, the second interlayer insulating layer 119, the first planarization layer 121, the second planarization layer 123, and the pixel defining layer 125 may be located at (e.g., in or on) the transmission area TA, and may include first to seventh holes H1, H2, H3, H4, H5, H6, and H7, respectively, overlapping with each other. Therefore, the light transmittance in the transmission area TA may be improved.

The second shielding layer SHL2 may be arranged under (e.g., underneath) the second pixel circuit PC2. For example, the second shielding layer SHL2 may be arranged between the substrate 100 and the buffer layer 111. The second shielding layer SHL2 may include a material different from that of the first shielding layer SHL1. The second shielding layer SHL2 may include a light blocking material, and the light blocking material may include, for example, a metal material such as chromium (Cr) or molybdenum (Mo), a black ink, and/or a dye.

The second shielding layer SHL2 may entirely overlap with the second pixel circuit PC2. The second shielding layer SHL2 may prevent or substantially prevent the light emitted from the electronic component 20 or directed to the electronic component 20 from diffracting through a narrow gap between lines connected to the second pixel circuit PC2, and may prevent or substantially prevent the light emitted from the electronic component 20 from entering the second pixel circuit PC2. Therefore, the performance of the electronic component 20 and the performance of the transistor of the second pixel circuit PC2 may be improved. However, the second shielding layer SHL2 may include the first throughhole TH1 overlapping with the transmission area TA, so as not to cause a decrease in transmittance in the transmission area TA.

The second shielding layer SHL2 may receive a constant or substantially constant voltage from the second pixel circuit PC2. For example, the second shielding layer SHL2 may be electrically connected to the source electrode or the drain electrode of the sixth transistor T6 of the second pixel circuit PC2, and may receive a constant or substantially constant voltage. In this case, the second shielding layer SHL2 may not be electrically floating, and the electrical characteristics of the transistors on the second shielding layer SHL2 may be stabilized or substantially stabilized.

Figure 11:
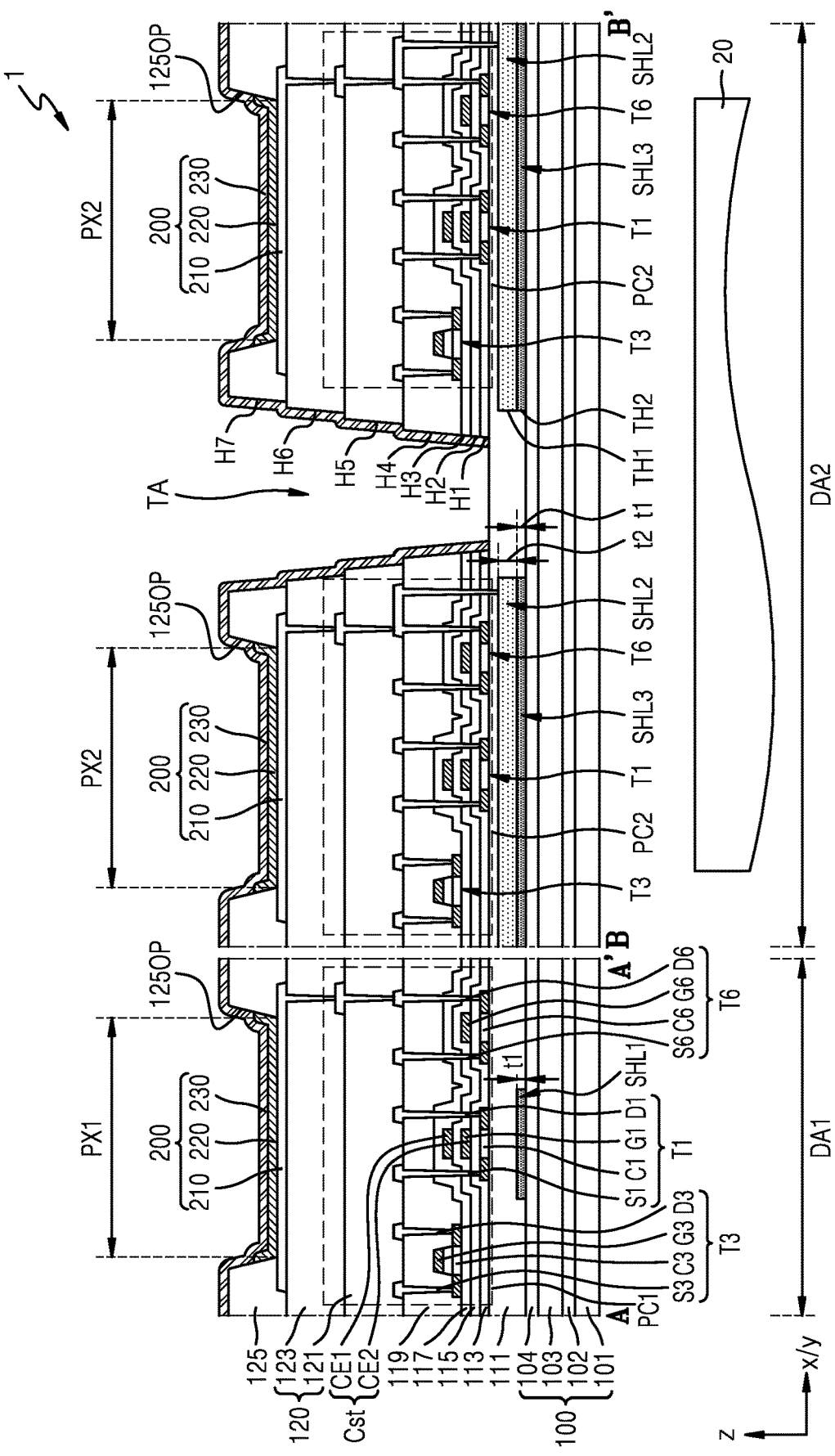
FIG. 11 is a schematic cross-sectional view of a portion of a display apparatus according to another embodiment.

FIG. 11 is a schematic cross-sectional view of a portion of a display apparatus according to another embodiment. A description of the configurations, components, or layers that are the same or substantially the same as (or similar to) those described above with reference to FIGS. 7 and 10 may not be repeated, and the differences therebetween may be mainly described in more detail below.

Referring to FIG. 11, a third shielding layer SHL3 corresponding to the second shielding layer SHL2 may be arranged at (e.g., in or on) the second display area DA2. The third shielding layer SHL3 may include a second through-hole TH2 overlapping with the first through-hole TH1 of the second shielding layer SHL2. Therefore, the light transmittance in the transmission area TA may be improved.

As an example, the third shielding layer SHL3 may be arranged between the second shielding layer SHL2 and the substrate 100. The third shielding layer SHL3 may be arranged at (e.g., in or on) the same layer as that of the first shielding layer SHL1. The third shielding layer SHL3 may include the same or substantially the same material as that of the first shielding layer SHL1, and may include a material different from that of the second shielding layer SHL2. In an embodiment, the third shielding layer SHL3 may include amorphous silicon. For example, the third shielding layer SHL3 may include amorphous silicon that is doped with impurities.

As a comparative example, when the third shielding layer SHL3 is not provided, two masks may be required to form the first shielding layer SHL1 and the second shielding layer SHL2 through a photolithography process. However, according to an embodiment, because the third shielding layer SHL3 that is arranged under (e.g., underneath) the second shielding layer SHL2 includes the same or substantially the same material as that of the first shielding layer SHL1, and is arranged at (e.g., in or on) the same layer as that of the first shielding layer SHL1, the first to third shielding layers SHL1, SHL2, and SHL3 may be formed with one mask. This may reduce manufacturing costs of the display apparatus, and may improve productivity thereof. A method of manufacturing the display apparatus 1 of FIG. 11 using the one mask will be described in more detail below with reference to FIGS. 14A to 14J.

Figure 12:
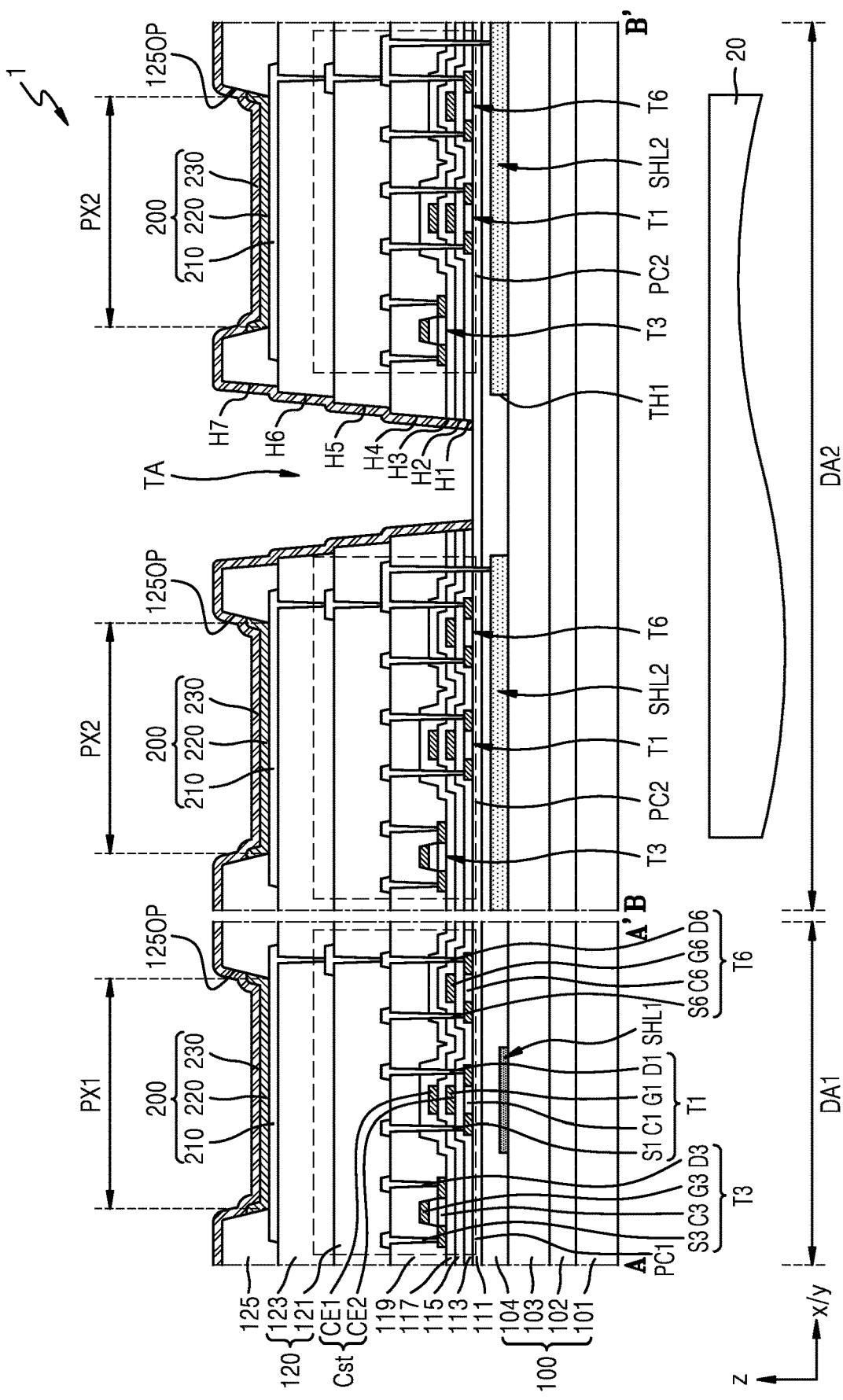
FIG. 12 is a schematic cross-sectional view of a portion of a display apparatus according to another embodiment.

FIG. 12 is a schematic cross-sectional view of a portion of a display apparatus according to another embodiment. A description of the configurations, components, or layers that are the same or substantially the same as (or similar to) those described above with reference to FIGS. 7 and 10 may not be repeated, and the differences therebetween may be mainly described in more detail below.

Referring to FIG. 12, a first shielding layer SHL1 and a second shielding layer SHL2 may be arranged between sub-layers of the substrate 100. For example, the first shielding layer SHL1 and the second shielding layer SHL2 may be arranged between the second base layer 103 and the second barrier layer 104 of the substrate 100. As the shielding layers are further spaced apart from a semiconductor layer of a transistor, the stability of the device characteristics of the transistor may be further increased.

Figure 13:
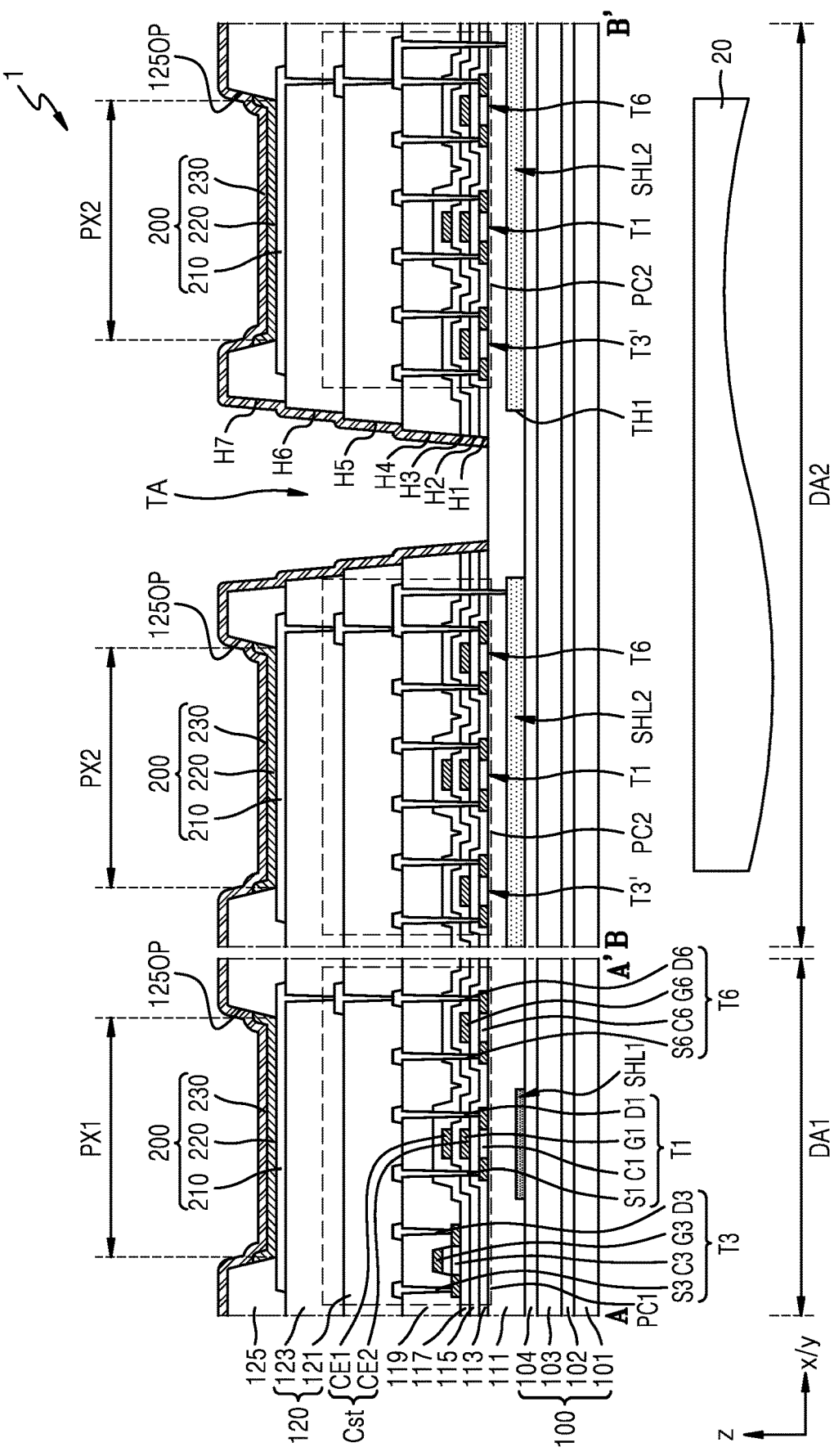
FIG. 13 is a schematic cross-sectional view of a portion of a display apparatus according to another embodiment.

FIG. 13 is a schematic cross-sectional view of a portion of a display apparatus according to another embodiment. A description of the configurations, components, or layers that are the same or substantially the same as (or similar to) those described above with reference to FIGS. 7 and 10 may not be repeated, and the differences therebetween may be mainly described in more detail below.

Referring to FIG. 13, the second pixel circuit PC2 may include only a silicon-based transistor. In this case, unlike the third transistor T3 of the first pixel circuit PC1, the third transistor T3' of the second pixel circuit PC2 may be provided as a silicon-based transistor. Although not illustrated in FIG. 13, similarly, the fourth transistor T4' of the second pixel circuit PC2 may be provided as a silicon-based transistor. In other words, the semiconductor layer of each of the third transistor T3' and the fourth transistor T4' may be arranged at (e.g., in or on) the same layer as that of the semiconductor layer of the first transistor T1, and may include the same or substantially the same material as that of the semiconductor layer of the first transistor T1.

FIGS. 14A to 14J are cross-sectional views schematically illustrating operations of a method of manufacturing a display apparatus, according to an embodiment.

Figure 14A:
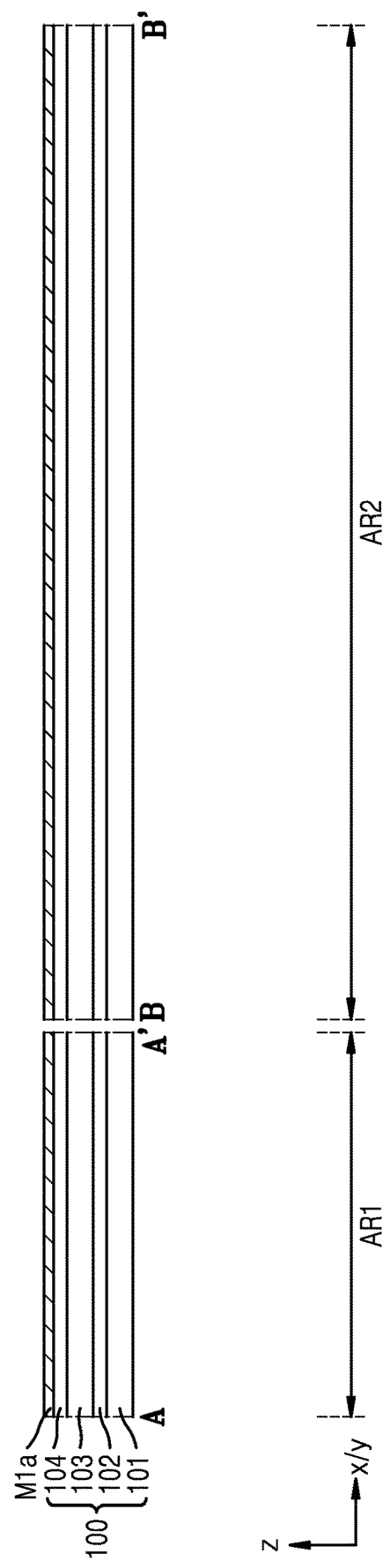
FIGS. 14A-14J are cross-sectional views schematically illustrating operations of a method of manufacturing a display apparatus, according to an embodiment.

Referring to FIG. 14A, a substrate 100 including a first area AR1, and a second area AR2 adjacent to the first area AR1 may be prepared. Because a first display area DA1 and a second display area DA2 are areas at (e.g., in or on) which an image is provided by a plurality of first pixels PX1 and a plurality of second pixels PX2, areas corresponding to the first display area DA1 and the second display area DA2 of the substrate 100, on which the pixels are not yet formed, are referred to as the first area AR1 and the second area AR2, respectively.

A preliminary first material layer M1a may be formed on the prepared substrate 100. For example, a deposition method such as chemical vapor deposition (CVD), thermochemical vapor deposition (TCVD), plasma deposition (PECVD), sputtering, e-beam evaporation, and/or the like may be used to form the preliminary first material layer M1a. The preliminary first material layer M1a may include, for example, an amorphous silicon material.

Figure 14B:
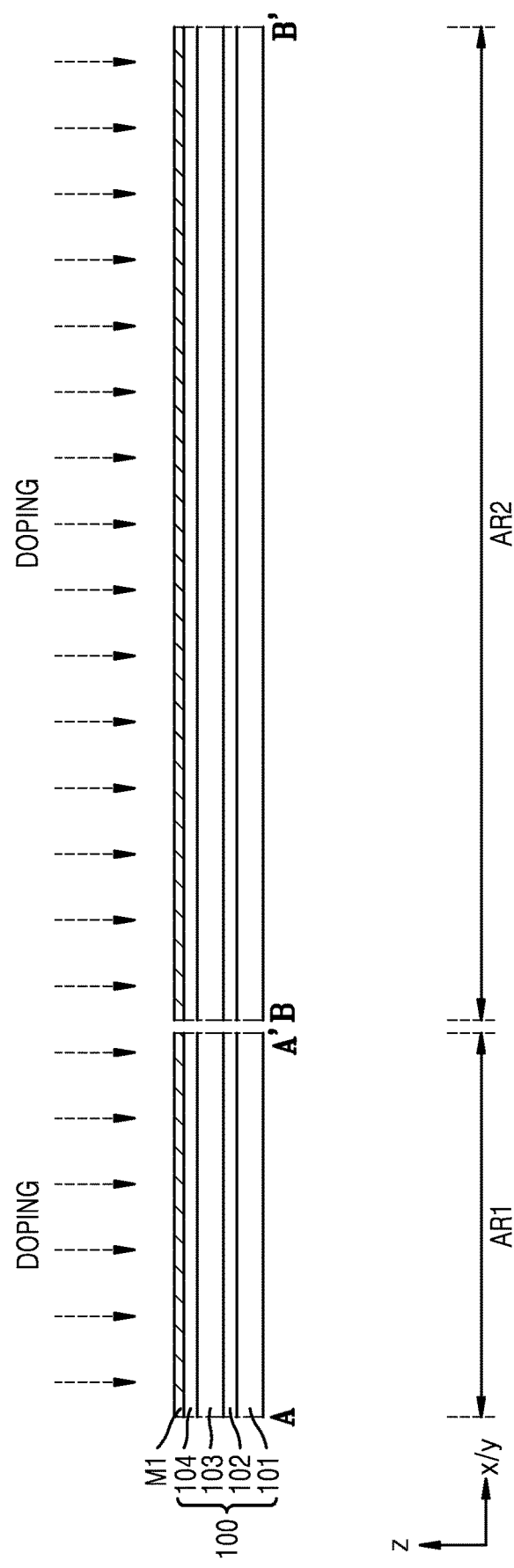

Referring to FIG. 14B, a first material layer M1 may be formed by doping the preliminary first material layer M1a with impurities. For example, an ion doping method may be used for the doping. In the ion doping method, after impurity gas is ionized, an electric field is accelerated without performing mass separation, and impurity ions are irradiated collectively onto the preliminary first material layer M1a. As another example, a plasma doping method may be used. The plasma doping method is a method of concurrently (e.g., simultaneously) ionizing impurity gas and film-forming gas to form a film on the surface of the substrate 100 together with the impurity ions.

Figure 14C:
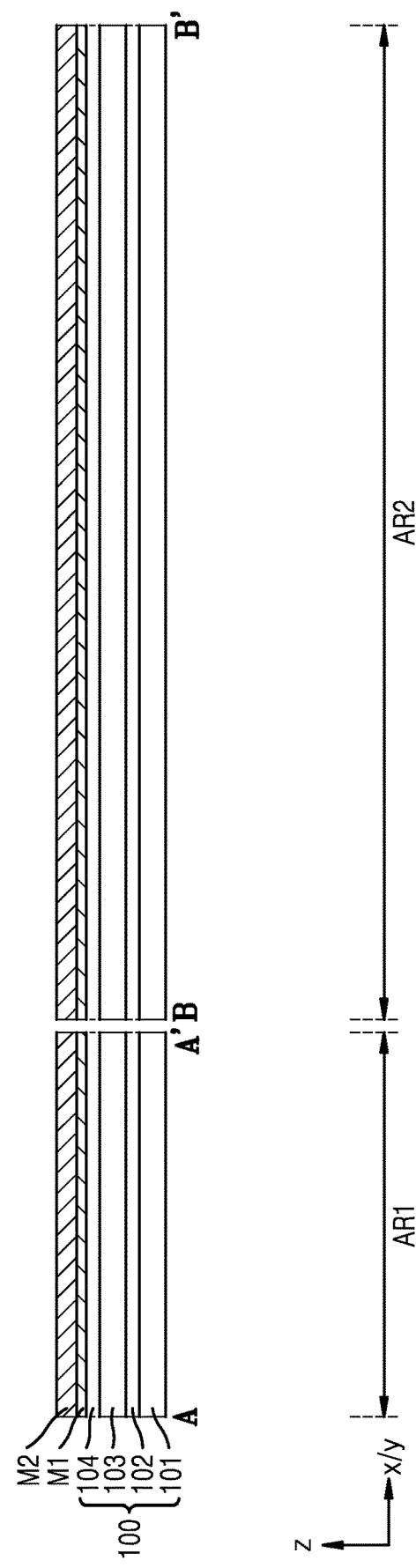

Referring to FIG. 14C, a second material layer M2 may be formed on the first material layer M1. The second material layer M2 may include a metal material such as chromium (Cr) or molybdenum (Mo), a black ink, and/or a dye. For example, a deposition method such as chemical vapor deposition (CVD), thermochemical vapor deposition (TCVD), plasma deposition (PECVD), sputtering, e-beam evaporation, and/or the like may be used to form the second material layer M2.

Figure 14D:
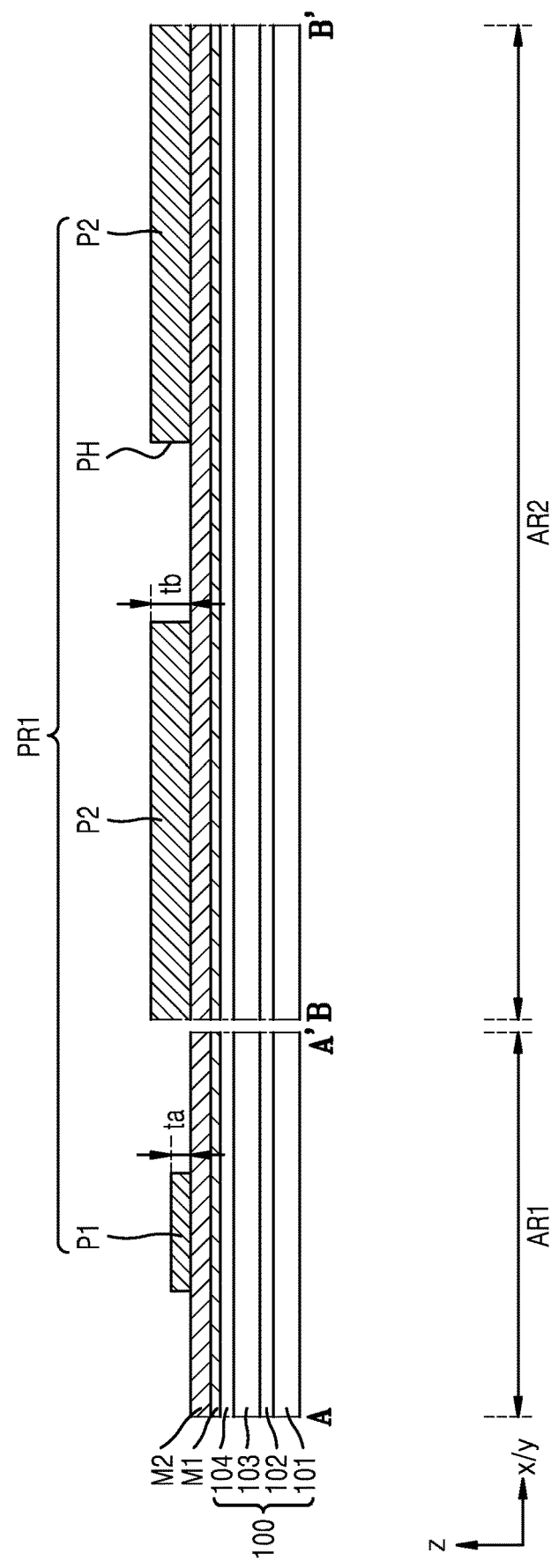

Referring to FIG. 14D, a first photoresist pattern PR1 may be formed on the second material layer M2. The first photoresist pattern PR1 may partially expose the second material layer M2, and may include a first portion P1 having a first thickness ta, and a second portion P2 having a second thickness tb that is greater than the first thickness ta. Each of the thicknesses ta and tb may refer to a shortest distance from the upper surface of the second material layer M2 to the upper surface of the first photoresist pattern PR1.

The first portion P1 may be located at (e.g., in or on) the first area AR1 of the substrate 100, and the second portion P2 may be located at (e.g., in or on) the second area AR2 of the substrate 100. In this case, the first portion P1 of the first photoresist pattern PR1 may correspond to an area in which the first shielding layer SHL1 is to be formed, and the second portion P2 of the first photoresist pattern PR1 may correspond to an area in which the second shielding layer SHL2 and the third shielding layer SHL3 are to be formed. The first portion P1 may be formed in an isolated type, and the second portion P2 may include a pattern hole PH. A first through-hole TH1 of the second shielding layer SHL2 and a second through-hole TH2 of the third shielding layer SHL3 may be formed by the pattern hole PH.

The first photoresist pattern PR1 may be formed by using one mask. The one mask may be a half-tone mask or a slit mask. The half-tone mask or the slit mask may be divided into a transmission area that transmits light, a semi-transmission area that partially transmits light, and a non-transmission area that blocks light transmission according to the light transmittance. When the photoresist is exposed through the one mask and then developed, photoresist areas corresponding to the transmission area and the semi-transmission area are removed by different thicknesses, and a photoresist area corresponding to the non-transmission area may remain without being removed. Therefore, the first photoresist pattern PR1 in each area may have different thicknesses from each other.

Figure 14E:
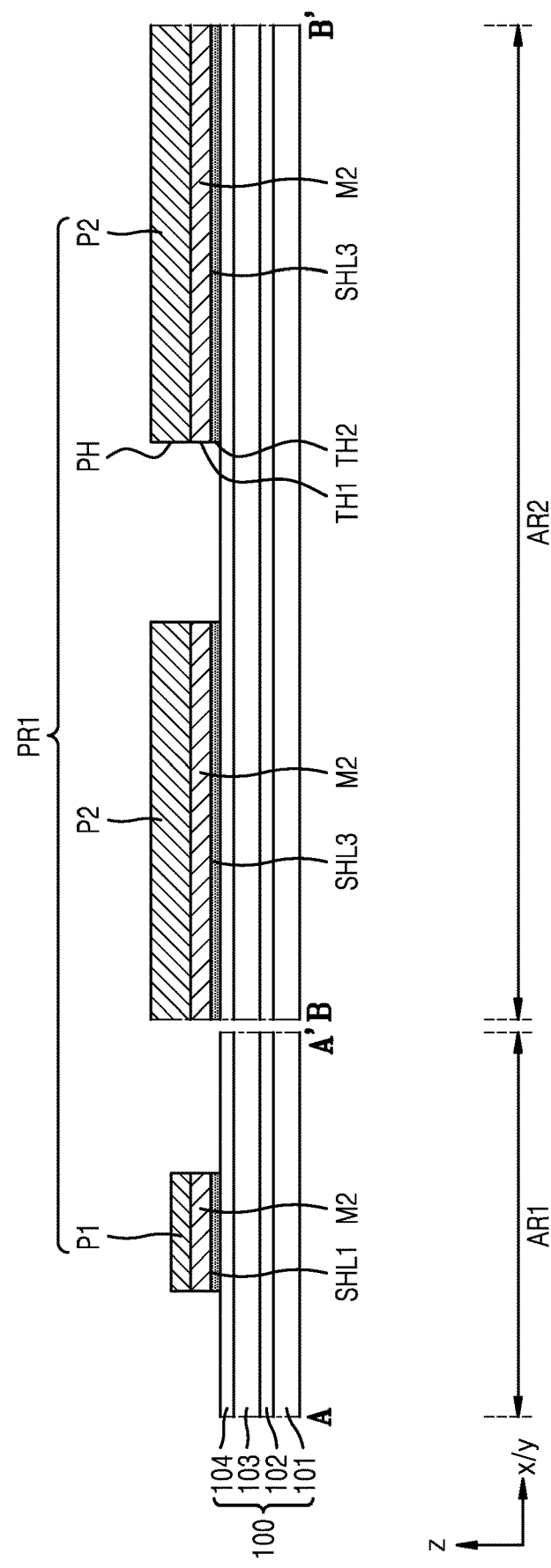

Referring to FIG. 14E, the first material layer M1 and the second material layer M2 may be partially removed. For example, the second material layer M2 may be etched by using the first photoresist pattern PR1 as an etching mask, and then the first material layer M1 may be partially removed. An area in which the removed portion of the first material layer M1 and the second material layer M2 are located may correspond to an area in which the first portion P1 and the second portion P2 of the first photoresist pattern PR1 are not located. For example, an etchant etches the second material layer M2 and the first material layer M1 through the pattern hole PH of the second portion P2 to form the first through-hole TH1 and the second through-hole TH2. The pattern hole PH may overlap with the first through-hole TH1 and the second through-hole TH2. The etching may be wet etching or dry etching. In this case, the first shielding layer SHL1 may be formed at (e.g., in or on) the first area AR1, and the third shielding layer SHL3 may be formed at (e.g., in or on) the second area AR2.

Figure 14F:
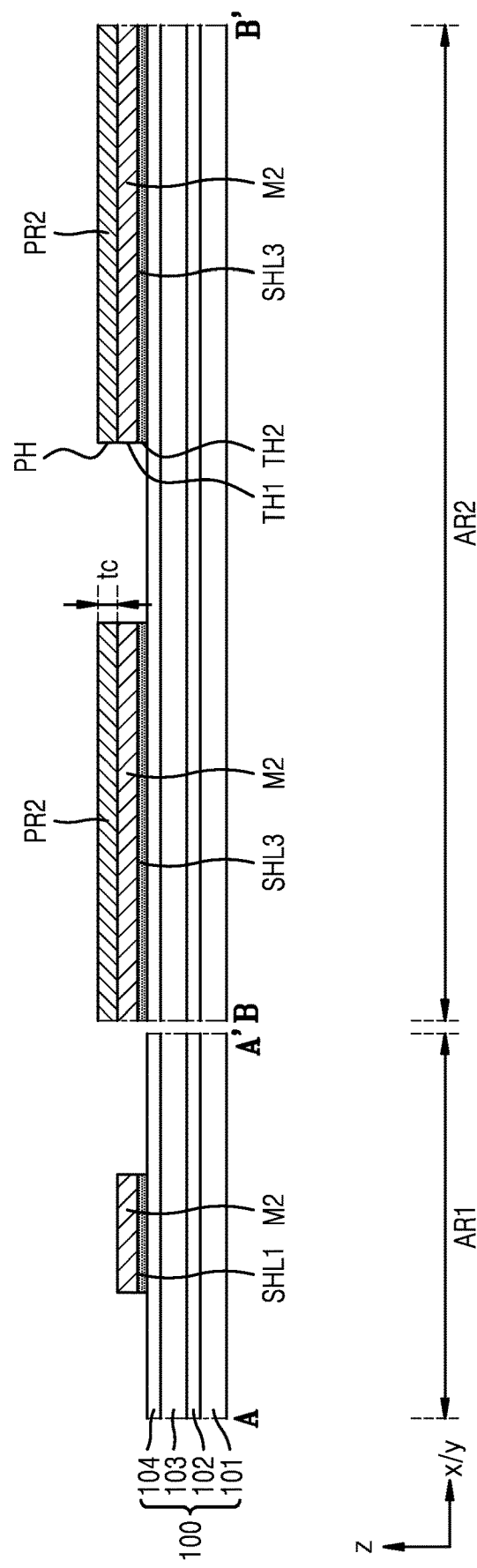

Referring to FIG. 14F, an etch-back process or the like may be performed to partially remove the first photoresist pattern PR1. For example, the first photoresist pattern PR1 may be removed by at least the first thickness ta by using an ashing process using oxygen gas. In this case, the first portion P1 of the first photoresist pattern PR1 may be completely removed, but the second portion P2 may only be partially removed and may remain as much as a third thickness tc, thereby forming the second photoresist pattern PR2. The second photoresist pattern PR2 may correspond to the second shielding layer SHL2.

Figure 14G:
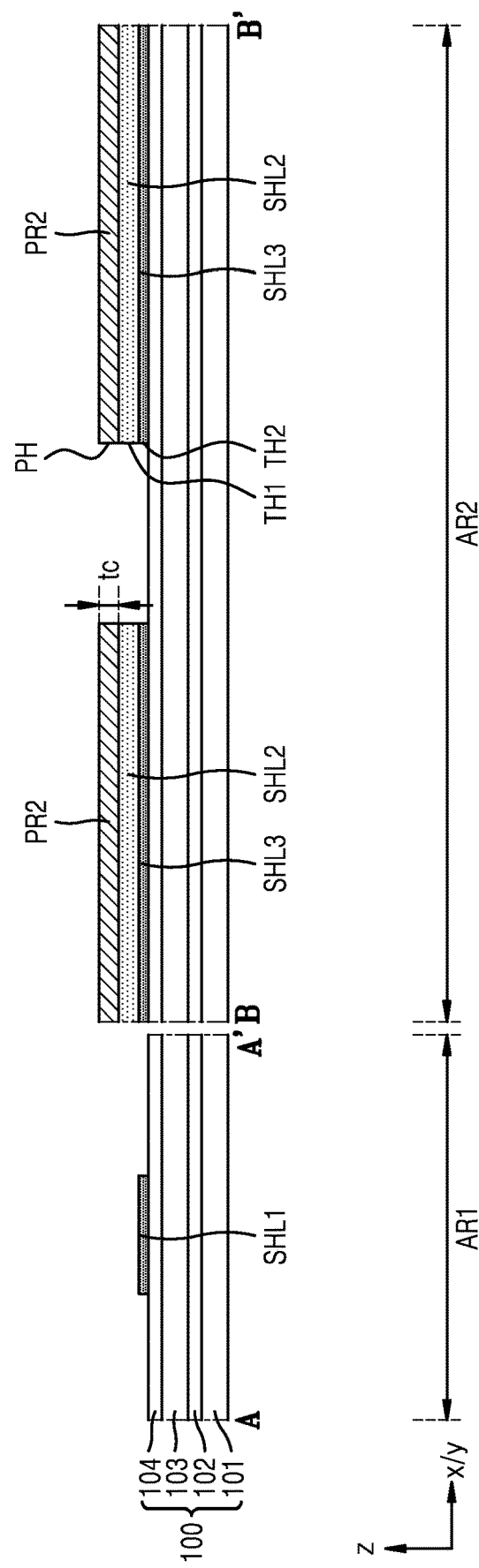

Referring to FIG. 14G, a portion of the second material layer M2 may be additionally removed. As an example, a portion of the second material layer M2 may be etched by using the second photoresist pattern PR2 as an etching mask. The etchant used at this time may remove only the second material layer M2 and may not remove the first material layer M1. In this case, the second shielding layer SHL2 may be formed at (e.g., in or on) the second area AR2.

Figure 14H:
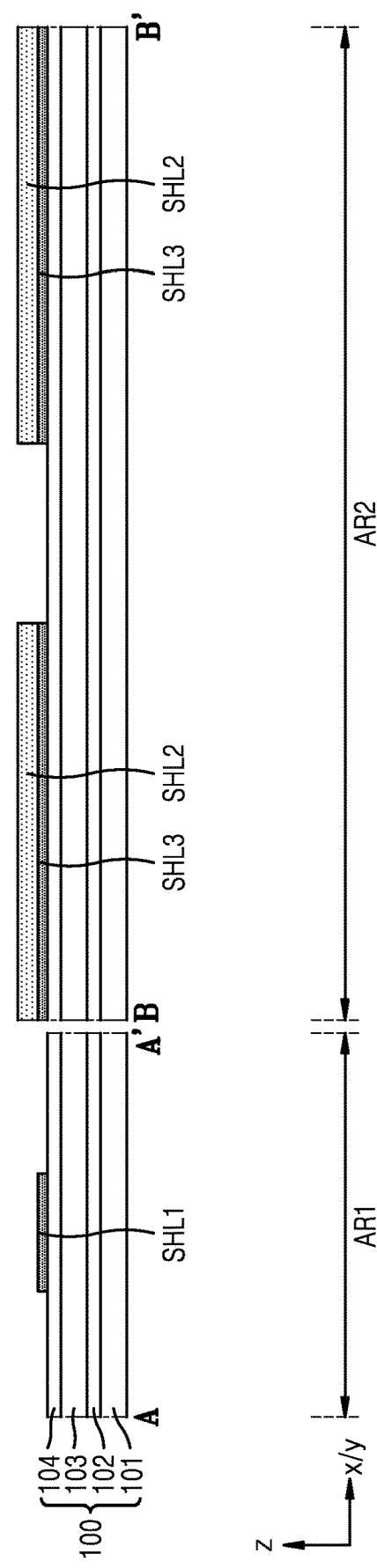

Referring to FIG. 14H, the second photoresist pattern PR2 may be removed.

Figure 14I:
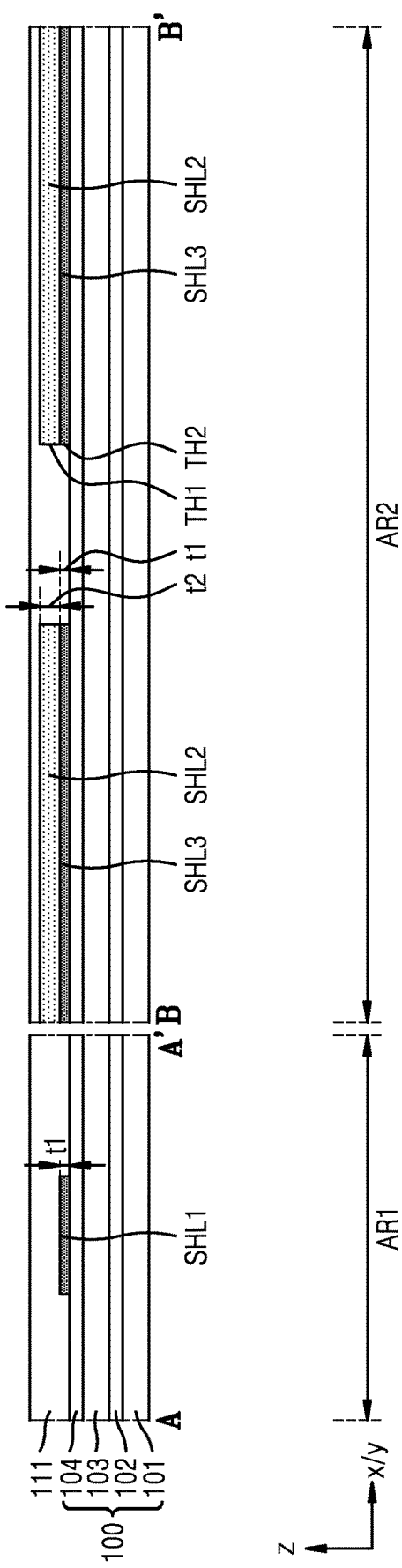

Referring to FIG. 14I, the buffer layer 111 may be formed on the first shielding layer SHL1, the second shielding layer SHL2, and the third shielding layer SHL3. For example, a deposition method such as chemical vapor deposition (CVD), thermochemical vapor deposition (TCVD), plasma deposition (PECVD), and/or the like may be used to form the buffer layer 111.

Figure 14J:
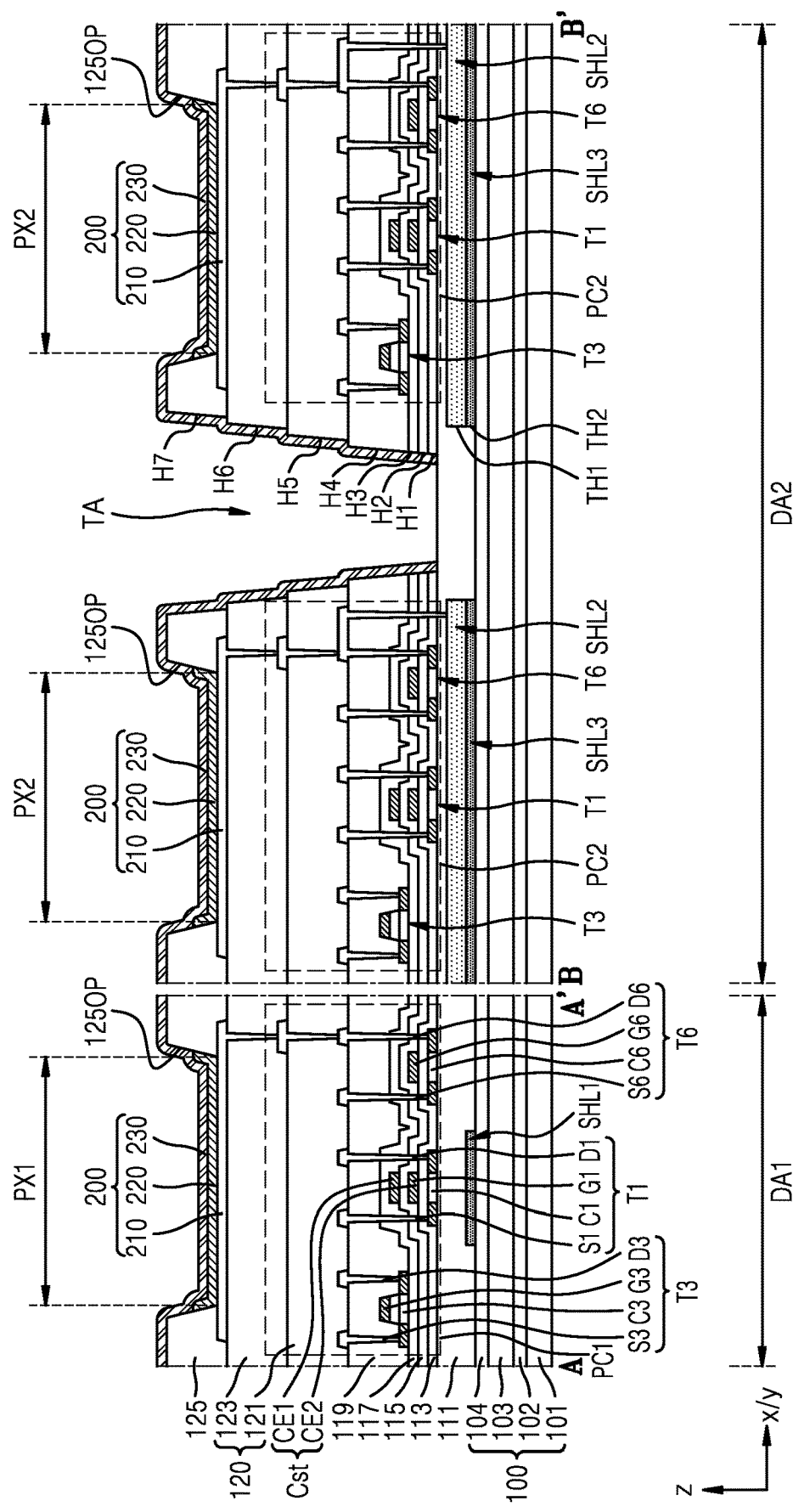

Referring to FIG. 14J, insulating layers, a pixel circuit including a plurality of transistors and a storage capacitor, a light-emitting device, and the like may be formed on the buffer layer 111. In this case, the display apparatus 1 may be manufactured.

The first display area DA1 may be formed by forming the first pixels PX1 and the first pixel circuits PC1 at (e.g., in or on) the first area AR1 of the substrate 100. The first shielding layer SHL1 may overlap with the first transistor T1 of the first pixel circuit PC1. The second display area DA2 may be formed by forming the second pixels PX2 and the second pixel circuits PC2 at (e.g., in or on) the second area AR2 of the substrate 100. The second shielding layer SHL2 and the third shielding layer SHL3 may overlap with the second pixel circuits PC2.

According to an embodiment, the display apparatus having an expanded display area for enabling images to be displayed even at (e.g., in or on) an area in which the electronic component is arranged may be implemented. Further, because the pixel circuit that drives the light-emitting element includes the silicon-based transistor and the oxide-based transistor, a high-resolution display apparatus having low power consumption may be provided. Further, because the shielding layer is provided under the transistor, the display apparatus in which the device characteristics of the transistor are more stabilized and display quality is improved may be provided. Furthermore, because the shielding layers are formed with one mask, the method of manufacturing the display apparatus that is capable of reducing the number of masks applied in the process of manufacturing the display apparatus to thereby reduce manufacturing costs and improve productivity may be provided. However, the present disclosure is not limited by such effects.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various embodiments and is not to be construed as limited to the specific embodiments disclosed herein, and that various modifications to the disclosed embodiments, as well as other embodi-

What is claimed is:

1. A method of manufacturing a display apparatus, the method comprising:
- forming a plurality of first pixel circuits at a first area of a substrate, each of the plurality of first pixel circuits comprising a silicon-based transistor and an oxide-based transistor;
- forming a plurality of second pixel circuits at a second area of the substrate that is adjacent to the first area, the plurality of second pixel circuits comprising transistors;
- forming a first shielding layer at the first area, the first shielding layer comprising a shielding pattern overlapping with the silicon-based transistor of each of the plurality of first pixel circuits;
- forming a second shielding layer at the second area, the second shielding layer comprising a first through-hole between adjacent second pixel circuits from among the plurality of second pixel circuits; and
- forming a third shielding layer at the second area, the third shielding layer comprising a second through-hole overlapping with the first through-hole of the second shielding layer,
- wherein the forming of the first shielding layer, the forming of the second shielding layer, and the forming of the third shielding layer use a same mask.

2. The method of claim 1, wherein the forming of the first shielding layer, the second shielding layer, and the third shielding layer by using the same mask comprises:
- forming a first material layer on the substrate;
- forming a second material layer on the first material layer;
- forming a first photoresist pattern on the second material layer, the first photoresist pattern comprising a first portion having a first thickness, and a second portion having a second thickness greater than the first thickness;
- forming the first shielding layer and the third shielding layer by removing portions of the first material layer and the second material layer by using the first photoresist pattern as a mask;
- forming a second photoresist pattern by removing the first photoresist pattern by the first thickness;
- forming the second shielding layer by additionally removing a portion of the second material layer by using the second photoresist pattern as a mask; and
- removing the second photoresist pattern.

3. The method of claim 2, wherein the first portion of the first photoresist pattern is at the first area of the substrate, and has an isolated shape, and
- wherein the second portion of the first photoresist pattern is at the second area of the substrate, and comprises a pattern hole overlapping with the first through-hole and the second through-hole.

4. The method of claim 2, wherein the forming of the first material layer comprises:
- forming an amorphous silicon layer on the substrate; and
- doping impurities into the amorphous silicon layer.

5. The method of claim 2, wherein the second material layer comprises a metal material.

6. The method of claim 1, wherein the second shielding layer and the third shielding layer overlap with transistors of the second pixel circuits.

7. The method of claim 1, further comprising forming a buffer layer on the first shielding layer, the second shielding layer, and the third shielding layer.

* * * * *